United States Patent [19]

Shibata

[11] Patent Number: 5,182,610
[45] Date of Patent: Jan. 26, 1993

[54] POSITION DETECTING METHOD AND DEVICE THEREFOR AS WELL AS ALIGNING DEVICE

[75] Inventor: Hiromasa Shibata, Tokyo, Japan

[73] Assignee: Sortec Corporation, Tokyo, Japan

[21] Appl. No.: 688,115

[22] Filed: Apr. 19, 1991

[30] Foreign Application Priority Data

Apr. 19, 1990 [JP] Japan .................................. 2-101571
Jul. 3, 1990 [JP] Japan .................................. 2-174585
Jul. 6, 1990 [JP] Japan .................................. 2-177236
Oct. 11, 1990 [JP] Japan .................................. 2-270580

[51] Int. Cl.$^5$ .............................................. G01B 9/02
[52] U.S. Cl. ............................. 356/349; 356/356; 356/363; 250/237 G
[58] Field of Search ............... 356/349, 400, 363, 356; 250/237 G, 231.18

[56] References Cited

U.S. PATENT DOCUMENTS 5,000,573 3/1991 Suzuki et al. ..................... 356/349

FOREIGN PATENT DOCUMENTS 89323 4/1989 Japan .

OTHER PUBLICATIONS

Itho et al., Proceeding of SPIE, vol. 773, Mar. 5, 1987, "A New Mask-to-Wafer Alignment Technique for Synchrotron Radiation X-ray Lithography", pp. 7-11.
Suzuki et al., J. Vac. Sci. Technol. B7(6), Nov./Dec. 1989, "An Optical-Heterodyne Alignment Technique for Quarter-Micron X-ray", pp. 1971-1976.
Ishihara et al., J. Vac. Sci. Technol. B7(6), Nov/Dec 1989, "A Vertical Stepper for Synchrotron X-ray Lithography", pp. 1652-1656.

Primary Examiner—Samuel A. Turner
Attorney, Agent, or Firm—Nields & Lemack

[57] ABSTRACT

The present invention relates to position detection, and aligning structure utilizing optical heterodyne method in semiconductor ultra fine processing or ultra accurate measuring. This is to provide a structure which contains pitches of not less than two kinds with respect to grating pitches of diffraction gratings which directly give influences to signal detecting range and detecting resolution, or which contains different values of not less than two kinds with respect to absolute values n of an order of ±n-th order injecting directions (or ±n-th order diffraction directions) to be determined by said grating pitches, so as to enable to enlarge a detecting range as maintaining a required detecting resolution (or a structure which can take out diffracted lights in different diffraction directions of not less than two).

22 Claims, 23 Drawing Sheets

FIG.13
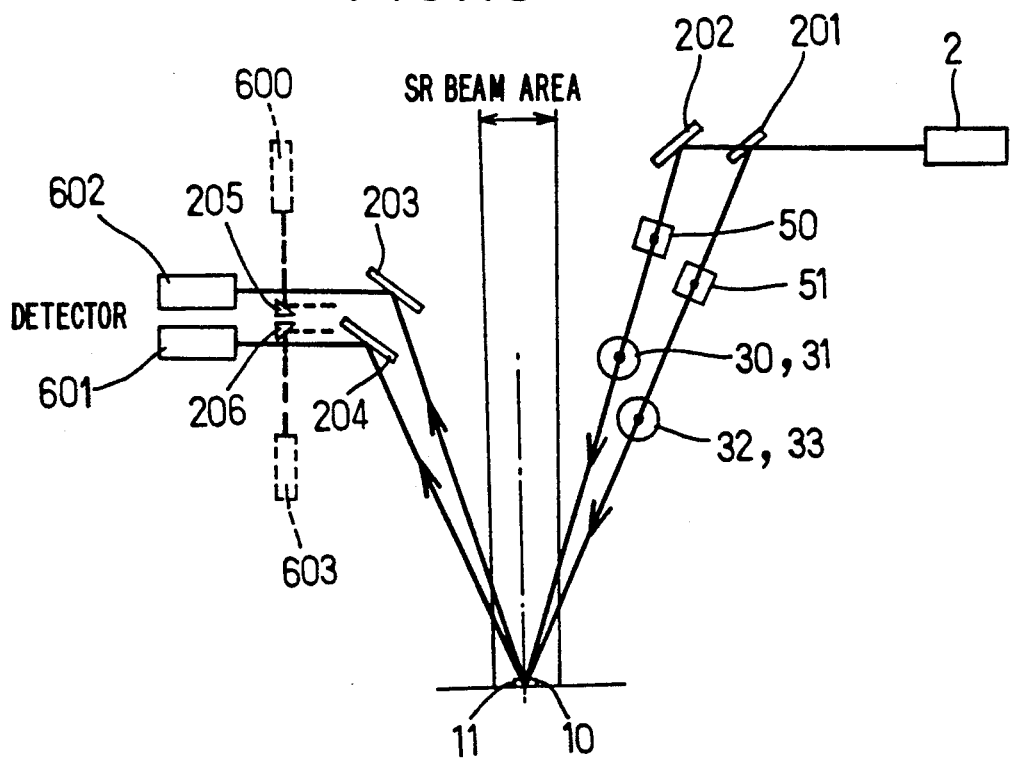
FIG.14(a)
FIG.14(b)
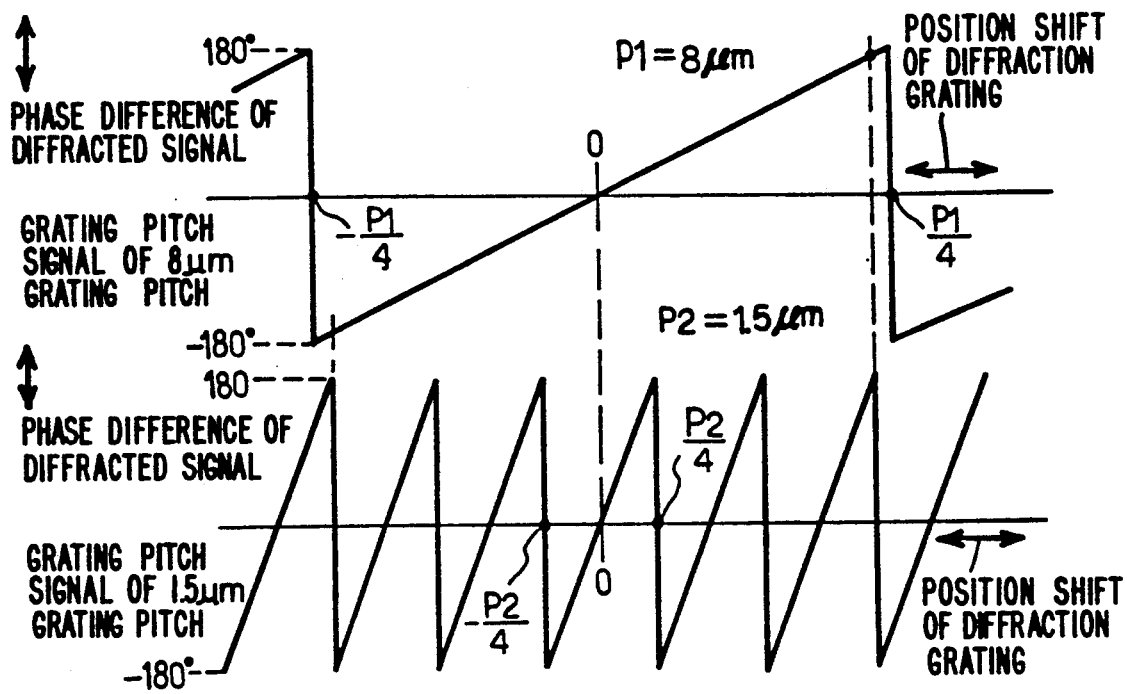

POSITION DETECTING METHOD AND DEVICE THEREFOR AS WELL AS ALIGNING DEVICE

FIELD OF THE INVENTION

The present invention relates to position detection, and aligning structure utilizing optical heterodyne method in semiconductor ultra fine processing or ultra accurate measuring. This is to provide a structure which contains pitches of not less than two kinds with respect to grating pitches of diffraction gratings which directly give influences to signal detecting range and detecting resolution, or which contains different values of not less than two kinds with respect to absolute values n of an order of $\pm$n-th order injecting directions (or $\pm$n-th order diffraction directions) to be determined by said grating pitches, so as to enable to enlarge a detecting range as maintaining a required detecting resolution (or a structure which can take out diffracted lights in different diffraction directions of not less than two).

BACKGROUND OF THE INVENTION

In accurate position detecting techniques such as a stepper for synchrotron radiation lithography, or a photo-stepper, an optical heterodyne position detecting system has been put to practice to trial machines, for example, Japanese Patent Laid-Open 62-261003 or same 64-89323.

FIG. 25 schematically shows a position detecting device which makes use of interference of diffracted beams in the optical heterodyne method shown in the former of said prior art.

This device is composed of respective diffraction gratings 1a, 1b formed on a mask A which is a first substance and on a wafer B which is a second substance; a light source 2 comprising a transverse Zeeman laser; incident angle adjusting means comprising mirrors 30, 31 which adjust directions of light separated by a later stated polarizing beam splitter, and inject the light from a direction of angle of $\pm\theta n$ ($\theta n$ satisfies $n\cdot\lambda = P\cdot\sin\theta n$ which is a formula of diffraction where $\lambda$ is wavelength of the light source, and n is a positive integer) with respect to normal lines of the grating faces of the diffraction gratings 1a, 1b; a light interference means comprising a polarization beam splitter 5 which separates two polarized beams from the light source 2 so as to branch them toward the mirrors 30, 31 respectively, and polarizing plates 58, 59 which cause the diffracted lights taken out from said diffraction gratings 1a, 1b in perpendicular directions with respect to the diffraction gratings to cause interfere each other; a detecting means comprising detectors 604a, 605a which detect beat signals generated by the interference of the light from the polarizing plates 58, 59; and a signal processing means 7 which detects phase differences of the beat signals detected by said detectors 604a, 605a.

The light emitted from the source 2 has two frequency components f1, f2, and is divided, via the polarization beam splitter 5, into a light of the frequency component of f1 and a light of the frequency component of f2, and these lights which are orthogonally polarized go into the diffraction gratings 1a, 1b from the $\pm$n-th order directions (e.g., $\pm$1st order directions) by the mirrors 30, 31. The lights f1, f2 (shown with dotted lines) diffracted in said perpendicular directions from the diffraction gratings 1a, 1b pass through a mirror 203 and a prism mirror 207, and are made coherent at the respective polarizing plates 58, 59, and the beat signals are detected by the detectors 604a, 605a. Between said detected beat signals, phase differences occur in proportion to amounts of positional shifts of the diffraction gratings 1a, 1b. By detecting said phase differences through a phase detector of the signal processing means 7, the amount of the relative positional shifts between the two diffraction gratings 1a, 1b may be conceived.

In the latter technology (64-89323), the above mentioned injection angle adjusting means has been changed, in which the light is caused to be injected to the diffraction gratings at desired angles through a reference grating and a Fourier transforming lens. As shown in FIG. 26, the coherent light emitted from the light source 2 is injected to the reference grating 38 and generates a diffracted light. The Fourier transforming lens 39 composed of a special filter and a pair of lenses selectively passes only such lights diffracted in $\pm$m-th order directions (m is a positive integer) among the lights diffracted by the reference grating 38, and such diffracted lights are injected from the $\pm$n-th order directions to the both diffraction gratings 1. In the same, the reference numeral 56a designates a half wave plate which rotates by 90° the polarizing condition of either of the lights diffracted by the reference grating 38, so that when the diffracted lights are re-diffracted later, this re-diffracted lights can interfere.

In the above mentioned optical heterodyne position detecting system, the larger are the grating constants of the diffraction gratings 1a, 1b, i.e., grating pitches P, or reversely the smaller are absolute values n of the order in the injecting direction of the coherent lights, the wider becomes the signal detecting range. The relation therebetween is the signal detecting range=P/2n. For example, when n is 1, $\frac{1}{2}$ of said pitch P falls within the detecting range.

However with respect to a detecting resolution, an absolutely reverse relation thereto is established. If accuracy of the resolution of the phase detector is assumed to be 1°, the detecting resolution is the detecting resolution=the signal detecting range/360°. So far as the absolute value n of the order in said light injecting direction is not increased, the larger is the grating pitch P, the lower becomes the accuracy of said detecting resolution. Therefore if trying to obtain the diffraction gratings 1a, 1b having the small grating pitches P for heightening the detecting resolution, the signal detecting range is made extremely narrower according to the above mentioned relations (when the absolute value n of the order in the injecting directions of the coherent lights are enlarged to heighten the detecting resolution, the same results are obtained as the above relation).

Therefore if trying to obtain a higher position detecting resolution by means of such an optical heterodyne position detecting system in the stepper for a synchrotron radiation lithography of a quarter micron level, the signal detecting range becomes very narrow. Thus, it has been difficult to put the conventional system to practice.

SUMMARY OF THE INVENTION

With respect to the grating pitches of the diffraction grating which give direct influences to the signal detecting range and the detecting resolution (both are in a contrary relation each other as said above), or with respect to the absolute values n of the order in the $\pm$n-th order injecting directions to be determined by said grating pitches, a basic structure of the present invention is characterized by such a structure where the pitches are not less than two kinds, or the injecting directions are not less than two kinds (that is, not less than two kinds of diffracted lights with different n value participate). Since the lights injected to the gratings from the directions of $\pm\theta n$ is diffracted in the perpendicular direction and the lights injected from the perpendicular direction is diffracted in directions of $\pm\theta n$, the both corresponding optical system can be constructed.

For example, as shown in FIG. 1, the first and second substances A and B are provided with the diffraction gratings 1a, 1b of the grating pitches P of not less than two (in the drawing, P1 and P2 where P1 > P2), and as shown in FIG. 2, the first and second substances are irradiated by the coherent lights from the different plural injecting directions in correspondence to the different value n of said order (e.g., 1st order and 4th order directions).

As is known, the phase difference $\Delta\phi$ and the position shift $\Delta X$ of the diffraction gratings 1a, 1b have the relation of $\Delta\phi = \{2\pi/(P/2n)\} \cdot \Delta X$. In the above mentioned structures (FIGS. 1 and 2), since P and n can take values of not less than two kinds, for the given $\Delta X$, not less than two kinds of $\Delta\phi$ can be obtained as seen in FIG. 3, where two kinds of $\Delta\phi$ to meet the requirements for wide detecting ranges (FIGS. 3(a) and 3(c)) as well as for high resolutions (FIGS. 3(b) and 3(d)) are represented.

That is, first ones (first group of claims 1 to 5) of the inventive position detecting method arrange the diffraction gratings of the different grating constants of not less than two with respect to the diffraction gratings provided on the first and second substances such as the mask and the wafer, and inject to these diffraction gratings the coherent lights of two frequencies slightly different from the $\pm$n-th order directions (actually from plural directions of +side and −side respectively by the formula of $n \cdot \lambda = P \cdot \sin \theta n$, although the absolute values n of orders are the same but since the grating pitches P are different). The diffraction lights are generated in vertical direction from each of said diffraction gratings, and the two frequency components are caused to interfere so as to generate beat signals respectively. Measurings are made on phase shifts of the beat signals obtained from the diffraction lights of the diffraction gratings of the equal diffraction constants among said diffraction gratings, and the amounts of displacements of said first and second substances are detected in accordance with said phase differences (by generating reference beat signals, the amount of absolute positional shifts may be also available for conceiving the respective displacement amounts of these two substances).

For example, the two diffraction gratings of the grating pitches P1 and P2 (P1 > P2 and P1/P2 = k) are arranged in two columns on the first and second substances (it is sufficient that the diffraction grating groups of the grating pitch P2 are positioned next to the diffraction grating groups of the grating pitch P1). If injecting the orthogonal polarized lights having slightly different two frequency components f1, f2 to said diffraction gratings from the 1st order directions, the diffraction lights emitted from the diffraction grating composed of the grating pitch P1 and the diffraction lights emitted from the diffraction gratings composed of the grating pitch P2, are separated, and the two frequency components f1, f2 of these diffraction lights are caused to interfere so as to generate the beat signals.

If detecting the phase difference between the beat signals by the diffracted lights from the diffraction gratings of the grating pitch P1 in the first and second substances, a signal wave shape from the phase detector is a linear shape where $\frac{1}{2}$ of the grating pitch P1 is a period. If detecting the phase difference between the beat signals by the diffraction lights from the diffraction gratings of the grating pitch P2, a signal wave shape is a linear shape where $\frac{1}{2}$ of the grating pitch P2 is a period. Therefore, depending upon the former signal wave shape, it is possible to cover a detecting range of k times of the latter, and depending upon the latter signal wave shape, it is possible to obtain a detecting resolution of k times of the former. If detecting the phase difference of the both signals at the same time, it is possible to cover the detecting range by the diffraction grating of the grating pitches P1 as maintaining the resolution by the diffraction gratings of the grating pitches P2.

As ways of detecting the displacement amounts of the first and second substances, although the above prior art does not disclose, lights diffracted in the $\pm$n-th order diffraction direction are detected to measure the position rotations of the gratings 1a, 1b. That is, the lights from the light source are injected in the perpendicular direction with respect to the diffraction gratings and is diffracted at angles $\pm\theta n$ ($\pm$n-th the order diffraction directions) from the diffraction gratings of the first and second substances, and the two frequency components are caused to interfere so as to generate the beat signal. It is possible to detect the displacement amounts by measuring the phase differences of these beat signals. The present invention may be also applied to this structure. Also in this case, the diffraction gratings of the different grating constants of not less than two kinds are similarly arranged in column on the first and second substances. The diffraction lights are taken out in the +n-th order diffraction directions (even if the absolute values n of the order are the same, but since the grating pitches are different, actually in plural directions of +side and −side) and are caused to interfere to generate the beat signals. By measuring the phase differences of the beat signals obtained from the diffraction lights of the diffraction gratings having the equal grating constants among the above mentioned diffraction gratings provided on the first and second substances, the displacement amounts of the first and second substances are detected.

In the above mentioned structure, in case the grating pitches of the diffraction gratings provided on the first and second substances are provisionally assumed to be P1 and P2, and if P1 is an integer multiple of P2, $\pm$1-th order diffraction lights resulted from the diffraction gratings of the pitch P1 and 1st order diffraction lights resulted from the diffraction gratings of the pitch P2 are emitted in the same direction and become probably noises. Therefore non-integer multiple is desirous.

Position detecting devices of the second and third inventions relate to the practical device of the position detecting method of the first invention. The second inventive device is a structrue for taking out the diffraction lights in the vertical directions with respect to the diffraction gratings, and the third inventive device is a structure for taking out the diffraction lights in the $\pm$n-th order diffraction directions.

That is, the second inventive device has the diffraction gratings comprising grating constants of not less than two kinds arranged in column on the first and second substances; a light source emitting the coherent lights of slightly different two frequency number; injecting angle adjusting means for injecting said coherent lights to the diffraction gratings from the +n-th order directions; light interference means for causing the two frequency components to interfere; detecting means for detecting the beat signals taken out in the vertical directions from the diffraction gratings of the first and second substances; and signal processing means for measuring the phase differences of the beat signals obtained by said detecting means from the diffraction lights of the diffraction gratings having the equal grating constants among the above mentioned diffraction gratings of the first and second substances, so as to detect the displacement amounts of the first and second substances in accordance with said phase differences.

The third inventive device has a structure which injects the lights from the vertical directions, and takes out the diffracted lights in the ±n-th order diffraction directions, and therefore is not provided with the injecting angle adjusting means as the second inventive device but provided with mirrors or means such as the polarized beam splitter for adopting the ±n-th order diffracted lights among the diffracted lights generated from the diffraction gratings. As premises of these structures, the third invention takes out the diffracted lights in the ±n-th order diffracting directions from the diffraction gratings by means of the diffracted light adopting means. Said detecting means is in accordance with the diffracted light adopting directions, thereby to enable to detect the beat signals. Concerning said signal processing means, the third invention measures, among the diffracted lights detected as the beat signals by the detecting means, the phase differences of the beat signals obtained from the diffracted lights of the diffraction grating having the equal grating constants of the first and second substances, so as to detect the displacement amounts of the first and second substances in accordance with said phase difference.

In addition, the fourth and fifth invention have developed and improved position aligning devices up to such structures which, based on the position detecting devices of the second and third inventions, can align the positions of the first and second substances. The structures proper to these inventions are provided with mechanisms for moving the first substance and/or the second substance, and are provided with the signal processing means which not only detect the positions of the first and second substances from the measured phase differences, but also supply control signals to said moving mechanism in accordance with said phase differences so as to move and align the first substance and/or the second substance. Other structures are the same as those of the second and third inventions.

On the other hand, with respect to the ±n-th order injecting directions of the coherent lights to be injected into the diffraction gratings provided on the first and second substances such as the mask and the wafer, another position detecting method of the present invention injects the coherent lights to the diffraction gratings from plural injecting directions with the different absolute values n of the order, detects the diffracted lights generated in vertical directions (defined later in detail) from the first and second diffraction gratings by said injections, causes the two frequency components to interfere as well as detects the beat signals generated by the interference, measures the phase differences of the beat signals finally generated from the interfering diffracted lights of the equal absolute values n of the order in said injecting directions among the diffracted lights taken out in the vertical directions, and detects the displacement amounts of said first and second substances in accordance with said measured phase differences (other than the amounts of the relative positional shifts, the amounts of the absolute positional shifts are also available by generating reference beat signals and getting the displacement amounts of the first and second substances).

For example, the present method makes the pitches P of the diffraction gratings of the first and second substances large to some extent, injects lights having the two frequency components f1, f2 slightly different in the orthogonally polarized lights from the ±1st directions and the ±4th directions, separates the diffracted lights from the first and second substances resulted from the 1st order injecting directions and the diffracted lights from the first and second substances resulted from the 4th order injecting directions, and causes the two frequency components f1, f2 of these diffracted lights to interfere so as to generate the beat signals. If detecting the phase differences between the beat signals by the diffracted lights from the first and second lights resulted from the 1st order injecting directions, the signal wave shapes become linear and ½ of the pitches P of the above diffraction gratings is a period. On the other hand, if detecting the phase differences between the beat signals by the diffracted lights from the first and second substances resulted from the ±4th order injecting directions, the signal wave shapes become linear and ⅛ of the pitches P of the above diffraction gratings is a period. Thus in the latter, the signal detecting range is ¼ of the former, but the signal detecting resolution is 4 times thereof. Therefore if the two phase differences are obtained at the same time, the displacement amounts may be measured within the ½ range of the grating pitch P, and it is possible to accomplish the resolution resulted from the ±4th order injecting directions.

The present invention may be also applied to the other method which has never been disclosed in the prior art (which detects the ±n-th order diffracted lights among the diffracted lights from the first and second diffraction gratings, causes the two frequency components to interfere, detects the beat signals generated by said interference, and measures the phase differences of these beat signals, thereby to detect the displacement amounts). In this case, the diffracted lights which are taken out in the ±n-th order diffracting directions from the diffraction gratings, are taken out in the plural diffracting directions where the absolute values n of the diffraction order are different, and are caused to interfere so as to detect the interfering lights, and measures the phase differences of the beat signals finally generated from the interfering diffracted lights of the equal absolute values n of the order are measured, and the displacement amounts of the first and second substances in accordance with these phase differences are obtained. It is of course possible to detect the displacement amounts by injecting from the plural injecting directions where the absolute values n of the order of the injection of the order of the diffraction are different values of not less than three, or taking out the diffracted lights from the plural (less than three) diffracting directions.

Position detecting devices as claimed in claims 13 and 14 relate to the practical device of a position detecting method as claimed in claim 12. The former is a structure for taking out the diffracted lights in the vertical directions with respect to the diffraction gratings, and the latter is a structure for taking out the diffrated lights in the ±n-th directions.

That is, in the position detecting device comprising the first diffraction gratings provided on the first substance; the second diffraction gratings provided on the second substance; the light source emitting the coherent lights of the slightly different two frequencies; the injecting angle adjusting means for injecting the coherent lights emitted from the light source toward the first and second diffraction gratings respectively from the ±n-th directions; the light interfering means for causing the two frequency components at the respective diffraction gratings to interfere so as to generate the beat signals; the detecting means for detecting the beat signals having been taken out from the first and second diffraction gratings in the vertical directions with respect to the diffraction gratings and generated by said light interfering means; and the signal processing means for measuring the phase differences of the beat signals and detecting the displacement amounts of the first and second substances from the measured phase differences, the inventive method as claimed in claim 13 is basically characterized by enabling to inject lights to the respective diffraction gratings from the plural directions in correspondence to the different absolute values n of the order (the injection of the coherent lights from the plural ±n-th directions to the diffraction gratings by said injecting angle adjusting means), and by enabling to detect the beat signals in correspondence to said injecting directions in the above mentioned detecting means, and by measuring the phase differences between the beat signals finally generated from the diffracted lights having the equal absolute values n in the order of said injecting directions among the diffracted lights taken out in the vertical direction with respect to the diffraction gratings as a result of injecting the coherent lights from the ±n-th order directions in the above mentioned processing means, thereby to detect the displacement amounts of the first and second substances in accordance with the measured phase differences.

The inventive device as claimed in claim 14 has a structure for injecting the lights from said vertical directions, and taking out the diffracted lights in the ±n-th order diffracting directions. The present device is not therefore provided with the injecting angle adjusting means as the device of claim 13, but is provided with diffracted light taking-out means as the mirrors or the polarized beam splitter for taking out the diffracted lights of the ±n-th orders among the diffracted lights generated from the diffraction gratings.

Based on the premise of the above mentioned structure, the invention as claimed in claim 14 takes out, in the plural diffracting directions where the absolute values n of the diffraction orders are different, the lights diffracted from the diffraction gratings in the ±n-th order diffracting directions by means of the diffracted light taking-out means. The detecting means enables to detect the beat signals in response to the diffracted light taking-out directions. Further, the signal processing means measures the phase differences between the beat signals finally generated from the diffracted lights having the equal absolute values n among the diffracted lights detected as the beat signals by the detecting means, thereby to detect the displacement amounts of the first and second substances in accordance with said phase differences.

The position aligning devices as claimed in claims 15 and 16 have been developed and improved, based on the position detecting devices as claimed in claims 13 and 14, until such structures where the first and second substances may be positioned. The proper structure thereof is provided with a moving mechanism to move the first and second substances and with signal processing means of detecting positions of the first and second substances from the measured phase differences, and further provided with a signal processing control means of issuing control signals to said moving mechanism in accordance with said phase differences and moving the first and/or second substances for position alignment. Other structures thereof are the same as those as claimed in claims 13 and 14.

The first group set forth in claims 1 to 5 and the second group of claims 12 to 16 as mentioned above may be used jointly without any contradictions.

In the above mentioned optical heterodyne position detecting system, phase gratings with rectangular cross sections or amplitude gratings are used as the diffraction gratings of the first and second substacnes. If such diffraction gratings are used as the claims 5 and 12 to claim 16, the larger become the absolute values n of the order in the coherent light injecting direction or in the diffracting directions of the diffracted lights, the lower becomes the diffraction efficiency. As a result, if the mask A or the wafer B has low reflecting power, the S/N ratio is decreased because of the difficulty in obtaining the good beat signals.

Therefore the inventor made studies on a method of selectively strengthening only the intensity of required ±n-th order diffracted lights (especially weak lights) among the lights to be diffracted by the diffraction gratings, thereby to remarkably improve the S/N ratio of the detected signal.

The inventor considered that big problems in conventional methods using the 1st order diffracted lights generated when the phase gratings or the amplitude gratings are used as the diffraction gratings, are to waste the 0th order light, and he studied concerning corporation of the 0th order light into the diffracted lights.

Thereupon, considerations were taken to diffraction gratings to be employed to the above mentioned structures for blazed gratings formed with specific surface shapes in regard to structures as claimed in claims of the 6, 7, 17 and 18 to be used to the above mentioned position detecting structures. The blazed gratings are diffraction gratings having triangular cross sections as seen in FIG. 4(a). In the diffraction grating of such shape, the strength of the diffracted lights are expressed as a superposition of the following two effects.

i) Diffracting effects due to a single oblique plane. That is, the lights, injected at an angle $\beta$ toward the normal line X1 of a slope having an inclination angle $\alpha$, are ejected in a just opposite reflecting direction, and they do not depend upon the grating constants P.

ii) Interfering effects from the whole gratings. That is, the lights, injected at an angle $\gamma$ toward the normal line X2 of the grating surfaces, are diffracted at an angle $\delta$ toward said normal line X2 in accordance with the normal relation of the diffraction, and they depend upon the grating constants P.

$$n \cdot \lambda = P (\sin \delta + \sin \gamma) \tag{1}$$

wherein,
n: Diffraction order

λ: Wavelength of injected lights
P: Grating pitch
δ: Ejecting angle of the diffracted lights to the normal line X2 of the grating surfaces
γ: Injecting angle of the lights to the normal line X2 of the grating surfaces.

Only the diffracted lights by the above effects (ii) may be obtained by the diffraction gratings with the normal rectangular cross section. But, in the blazed gratings, if the angle α is set appropriately, it is possible to render the ejecting angles of the above (i) and (ii) to coincide, and increase the strength of required diffracted lights. Since the lights by (i) are reflected lights having the strength of the 0th order lights, they are far stronger than the n-th order lights of (ii).

The angles of the slopes where the ejecting angles of (i) and (ii) coincide with each other (such angles are called as "blazed angle" which will be expressed with "αb") are considered as follows.

If the inclination angle of the slope in FIG. 4(b) is the blazed angle αb, an angle between the normal line X2 of the grating surface and the normal line X1 of the grating slope is αb If the injecting angle of the injecting light to the normal line X2 of the grating surface is θ, an outgoing angle thereof is expressed with δ. Accordingly, the injecting angle φ to the normal line X1 of the slope is φ=θ−αb, and the outgoing angle δ is δ=θ−2φ. Therefore, from the both relations, δ=θ−2(θ−αb) =2αb−θ. If the injecting angle θ and the outgoing angle δ are substituted into the relation (1) of the above diffraction, $$n \cdot \lambda = P \cdot \{\sin(2\alpha b - \theta) + \sin \theta\} \quad (2).$$

Herein, if using a formula of $\sin(\alpha+\beta)+\sin(\alpha-\beta)=2\sin\alpha\cdot\cos\beta$ and rewriting the above relation (2), $\sin\theta + \sin(2\alpha b - \theta) = 2\sin\alpha b \cdot \cos(\theta - \alpha b)$, and therefore $$n \cdot \lambda = 2P \sin \alpha b \cos(\theta - \alpha b) \quad (3).$$

It is sufficient to set an angle αb satisfying this condition.

According to the condition of a following relation (4), the outgoing direction of the diffracted light can be arranged parallel to the normal line X2 of the grating surface.

$$\theta = 2 \cdot \alpha b. \quad (4)$$

As for the injection and the diffraction directions, there is another choice as shown in FIG. 5. That is, the injecting lights come from a direction parallel to the normal line X2 of the grating surface, and the diffracted lights outgo in a direction having an angle θ with respect to the normal line X2.

If making diffraction gratings which may satisfy the above said conditions in the right and left slopes of the blazed gratings as shown in FIG. 5, it is possible to strengthen both of the conjugate diffracted lights particular to the +n-th order.

Thus, by converting the diffraction gratings 1a, 1b to reflection type blazed gratings where the cross sections thereof are isosceles triangular and the slopes have the blazed angle αb, the diffraction efficiency may be further heightened. That is, as said above, such blazed gratings also adopt 0th order lights reflected on the both slopes other than the normal +n-th order defracted lights. Accordingly, the diffracting efficiencies thereof are assumed to be strengthened by several times to several hundred times in comparison with the normal gratings of rectangular cross section.

When the optical heterodyne system is installed in an exposure device utilizing soft X-rays of synchrotron radiation, the constituent optical elements such as various mirrors or detectors are required to be arranged in such a manner that they do not disturb the X-ray pass.

In an orthogonal coordinate system (x, y, z), suppose that the z axis corresponds to the X-rays pass, the x axis to the direction L (along the groove of the gratings), the y axis to the direction H as in FIG. 1 and the coherent lights are injected along the line connecting the origin (0, 0, 0) and the point (O, Y, Z). The angle $\theta n$ between the z axis and the injection directions of said coherent lights satisfy the diffraction formula (P·sin $\theta n = n \cdot \lambda$). In such a case, lights are diffracted along the z axis. This is undesirable. Accordingly, lights should be injected along the line (R) connecting the origin (0, 0, 0) and the point (X, Y, Z). Here, the angle between the z axis and the line R1 (projection of R in the yz plane) is ±n and the angle between the z axis and the line R2 (projection of R in the zx plane) is φ (hereinafter, this angle is called as the oblique angle). Since, in this case, lights are diffracted along the line connecting (0, 0, 0) and (−X, O, Z) with the same oblique angle φ, the X-rays pass is not disturbed. For the simplicity, such a situation is illustrated in the ground plane as shown in FIG. 7, and the diffraction direction is designated as "vertically". In this case, $\theta n$ is determined by the following relation;

$$P \cdot \cos \phi \sin \theta n = n \cdot \lambda \quad (5)$$

In the present invention, not less than two kinds of the diffracted lights are used as mentioned before, such a danger probably occurs that diffracted lights are taken out in overlapping. In order to avoid such occasions, as shown in FIG. 7(a)(b) [the same (a) shows a structure provided with the grating pitches of not less than two, and the same (b) shows a structure where the absolute value n of the order is not less than two with respect to the ±n-th order injecting directions], the coherent lights are injected with the different oblique angles φ1, φ2.... However, such an optical system with the plural oblique angles has faults that the quantity of the constituent optical elements such as mirrors and detectors becomes large, and the adjustment of the optical axis becomes very complicated. Moreover, a space is widened so much for occupying the optical system.

The present invention is therefore to propose a position detecting method which may simplify the optical system so as to easily perform the adjustment of the optical axis and realize to save the space, and a position aligning method which uses the position detecting structure as it is, in a 8th to an 11th method and in a 19th to a 22nd methods (the 8th and 9th inventions; the 10th and 11th inventions; the 19th and 20th inventions; and the 21st and 22nd inventions are relative with the position aligning method which uses the position detecting method and the structure as they are).

These structures are summerized that the diffracted lights which are taken out in the "vertical" directions, are taken out as overlapping one another. In other words, all of the coherent lights are injected with the same oblique angle, and consequently the optical axes of the lights diffracted from the same diffraction grating 1(a) or 1(b) coincide. Since the length of the optical passes are different, the optical axis of the lights from the gratings 1(a) does not coincide with that from 1(b), and they become to be parallel. Beat signals are detected under the condition that the diffracted lights remain overlapping. Thus, not less than two kinds of the beat signals from the different sources (i.e., different pitches or different absolute values n of the order) are superposed and they are separated during the signal processing. Another way of the detection is like that the overlapping of the diffracted lights from the different sources is removed before the superposed beat signals are detected.

When the beat signals are detected under the superposed condition, not less than two couples of the coherent lights, each couple composed of the lights with slightly different frequencies as seen in FIG. 8(a) (for example, f1 and f2 as well as f3 and f4, or f1 and f2 as well as f2 and f3) are employed. The beat frequencies of each couple of coherent lights are different (for example, the beat frequencies fa is not equal to the beat frequency fb, where fa=|f1−f2| and fb=|f3−f4|. These couples of the coherent lights are utilized in correspondence to the diffraction gratings with the different pitches respectively or the different absolute values n respectively). Since the beat signals from these different sources are detected under the superposing condition, the detected signal has the profile as shown in FIG. 9(a). The superposed signals are separated by the use of frequency filters PF1 to PF4, and the high frequency component and low frequency component are obtained as shown in FIGS. 9(b) and (c). Finally, the phase differences are measured among the beat signals with the same beat frequency derived from the 1st and 2nd substances.

On the other hand, when the beat signals are detected as in the latter case without the overlapping of the diffracted lights, not less than two couples of the coherent lights, of which the example is illustrated in FIG. 10(a), are employed. Here, the both of the two couples consist of the coherent lights with the frequencies f1 and f2, and the planes of polarization in the first couple are vertical and those in the second couple are horizontal. It should be emphasized that the planes of polarization in the different couples are made to be different. The beat frequencies (in the above example, the both are |f1−f2|) are not necessarily equal. The diffracted lights have the both frequencies f1 and f2, and each frequency component contains the two kinds of the planes of polarization (i.e., vertical and horizontal). That is, the beat signals derived from the f1 and f2 lights have the two kinds of the planes of polarization. These are separated by uusing the polarized beam splitters PBS1, PBS2 and etc, as shown in FIG. 10(b). Finally, the phase differences are measured among the beat signals with the same plane of polarization derived from the 1st and 2nd substances.

A further reference will be made to the structure of the position detecting method.

The 8th invention is characterized by arranging not less than the two kinds of the diffraction gratings with the different pitches in column the both on the 1st and 2nd substances, making one couple with the lights which are slightly different in the frequencies and may interfere when diffracting, injecting the plural couples of the coherent lights where the frequencies of the beat signals of the respective couples generated at interfering are different between these couples, at the same oblique angle per each of the couples from the ±n-th order directions to be determined in response to the pitches of said diffraction gratings, dividing the interfering lights which are vertically diffracted from the diffraction gratings of the 1st and 2nd substances by said injections and taken out at the same oblique angle, into those obtained from the diffraction gratings of the 1st and 2nd substances for detection, passing the overlapping beat signals obtained from these interfering light through the frequency filters so as to classify those of single beat frequency signals, and measuring the phase differences of the beat signals of the same frequency so as to detect the displacing amount of the 1st and 2nd substances in accordance with these phase differences.

The 10th invention is characterized by arranging not less than the two kinds of the diffraction gratings with the different pitches in column the both on the 1st and 2nd substances, making one couple with the lights which are slightly different in the frequencies and may interfere when diffracting, injecting the plural couples of the coherent lights where the planes of polarization are different between these couples, at the same oblique angle per each of the couples from the ±n-th order directions to be determined in response to the grating pitches of said diffraction gratings, dividing the interfering lights which are "vertically" diffracted from the diffraction gratings of the 1st and 2nd substances by said injections and taken out at the same oblique angle, into those obtained from the diffraction gratings of the 1st and 2nd substances for detection, separating these interfering lights per each of the planes of poralization, and measuring the phase differences of the beat signals obtained from the interfering lights of the equal plane of poralization in accordance with these phase differences.

An invention as claimed in claim 19 (19th invention) is characterized by making one couple with the lights which are slightly different in the frequencies and interfere one another when diffracting, injecting the plural couples of the coherent lights where the frequencies of the beat signals of the respective couples generated at diffracting are different between these couples at the same oblique angle from the plural ±n-th order directions where the absolute values n of the order are different toward the diffraction gratings, dividing, for detection, the interfering lights which are vertially diffracted by said injection from the respective gratings of the 1st and 2nd substances and taken out at the same oblique angle, into those obtained from the respective diffraction gratings, passing the overlapping beat signals obtained from these interfering lights through the frequency filters so as to classify them into those of single beat frequencies, and measuring the phase differences of the beat signals with the equal frequency so as to detect the displacing amounts of the 1st and 2nd substances in accordance with said phase differences.

A 21st invention is characterized by making one couple with the lights which are slightly different in the frequencies and interfere one another when diffracting, injecting the plural couples of the coherent lights where the planes of polarization are different between these couples, at the same oblique angle from the plural ±n-th order directions where the absolute values n of the order are different toward the diffraction gratings, dividing, for detection, the interfering lights which are "vertically" diffracted by said injection from the respective diffraction gratings of the 1st and 2nd substances and taken out at the same oblique angle, into those obtained from the respective diffraction gratings, separating these interfering lights per each of the planes of polarization, and measuring the phase differences of the beat signals obtained from the interfering lights of the equal planes of polarization so as to detect the displacing amounts of the 1st and 2nd substances in accordance with said phase differences.

With respect to the instruments of causing the lights to interfere in these inventive structures, there is a method of combining the polarized beam splitter and the polarization plate as said above, and it is also possible to combine the polarized beam splitter and a ½ wavelength plate or combine the beam splitter, the ½ wavelength and the polarization plate. Namely, when injecting the coherent ligths from the ±n-th order directions, the ½ wavelength plate rotates 90° one of the planes of polarization of the +n-th order light having only f1 component taken out by the polarization beam splitter or having the both components of f1 and f2 taken out by the beam splitter, or of the −n-th order light having only f2 component taken out by the polarization beam splitter or having the both components of f1 and f2 taken out by the beam splitter, so as to inject toward the diffraction gratings, so that it is possible to cause the lights to interfere (in the latter case with the both components of f1 and f2, one of the interfered lights having the horizontal or the vertical plane of polarization is further cut with the polarizing plate so as to detect the other), and when the coherent lights are vertically injected to the diffraction gratings and the diffracted lights of the ±n-th order among the diffracted lights generated thereabout are taken out, one of the +n-th order or −n-th order diffracted lights is processed in the same manner with the ½ wavelength plate and it also becomes possible to cause the lights to interfere before detecting the ±n-th order diffracted lights.

BRIEF DESCRIPTION OF THE DRAWINGS

FIG. 13 is a side view seen from the real side in the length direction L of the diffraction gratings of the above embodiment;

FIGS. 14(a)(b) show waves of the beat signals obtained by the structure of the 1st embodiment;

DETAILED DESCRIPTION OF THE PREFERRED EMBODIMENTS

Figure 11:
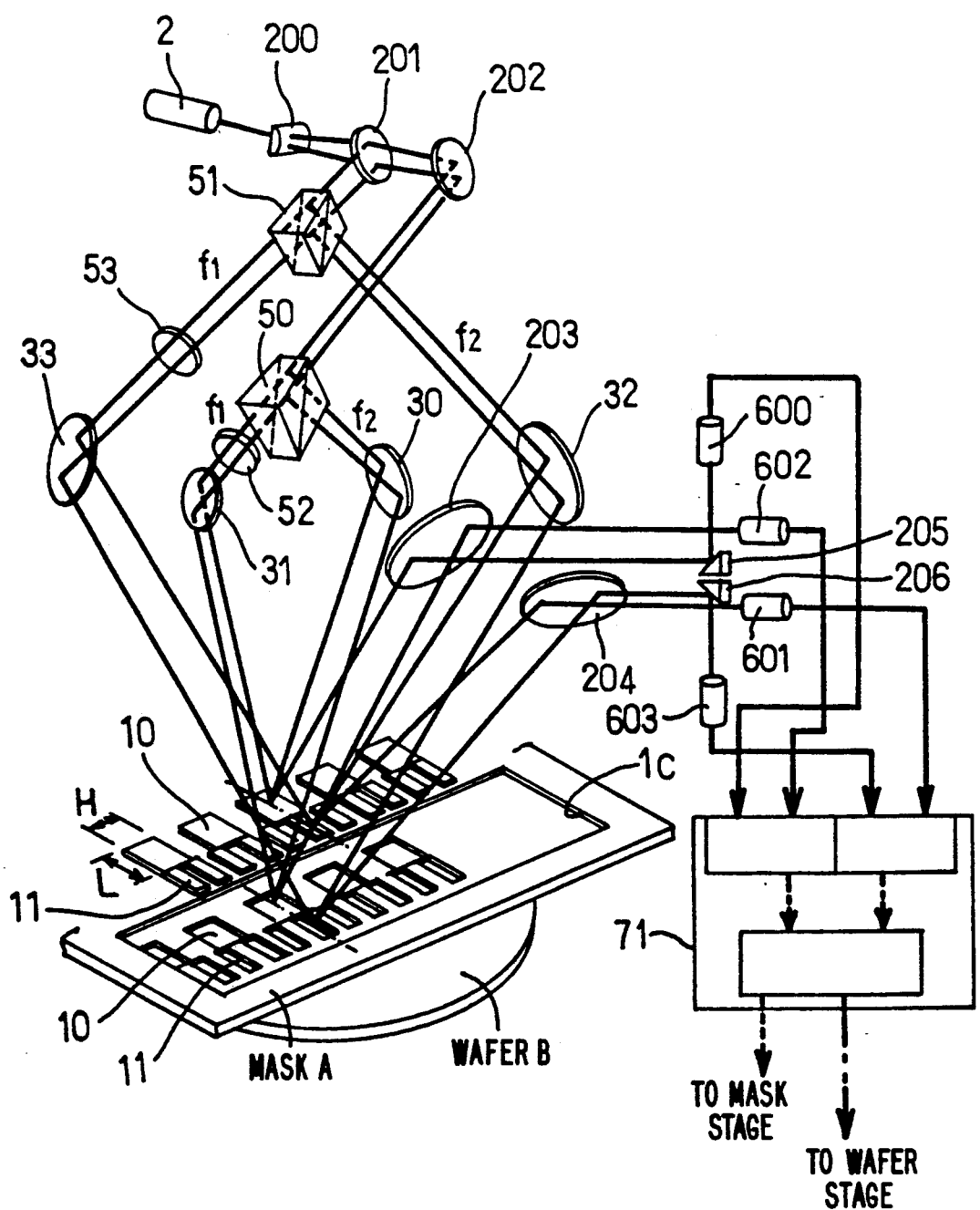
FIG. 11 is a perspective view showing a 1st embodiment of the invention relating to a structure of one of the embodiments of the position aligning apparatus of the 4th invention.

FIG. 11 shows an outline of a structure of a position aligning device according to the 4th invention for aligning a mask A as the 1st sustance and a wafer B as the 2nd substance in an exposure device by the use of the synchrotron radiation, omitting moving mechanisms of the mask and the wafer.

Figure 12:
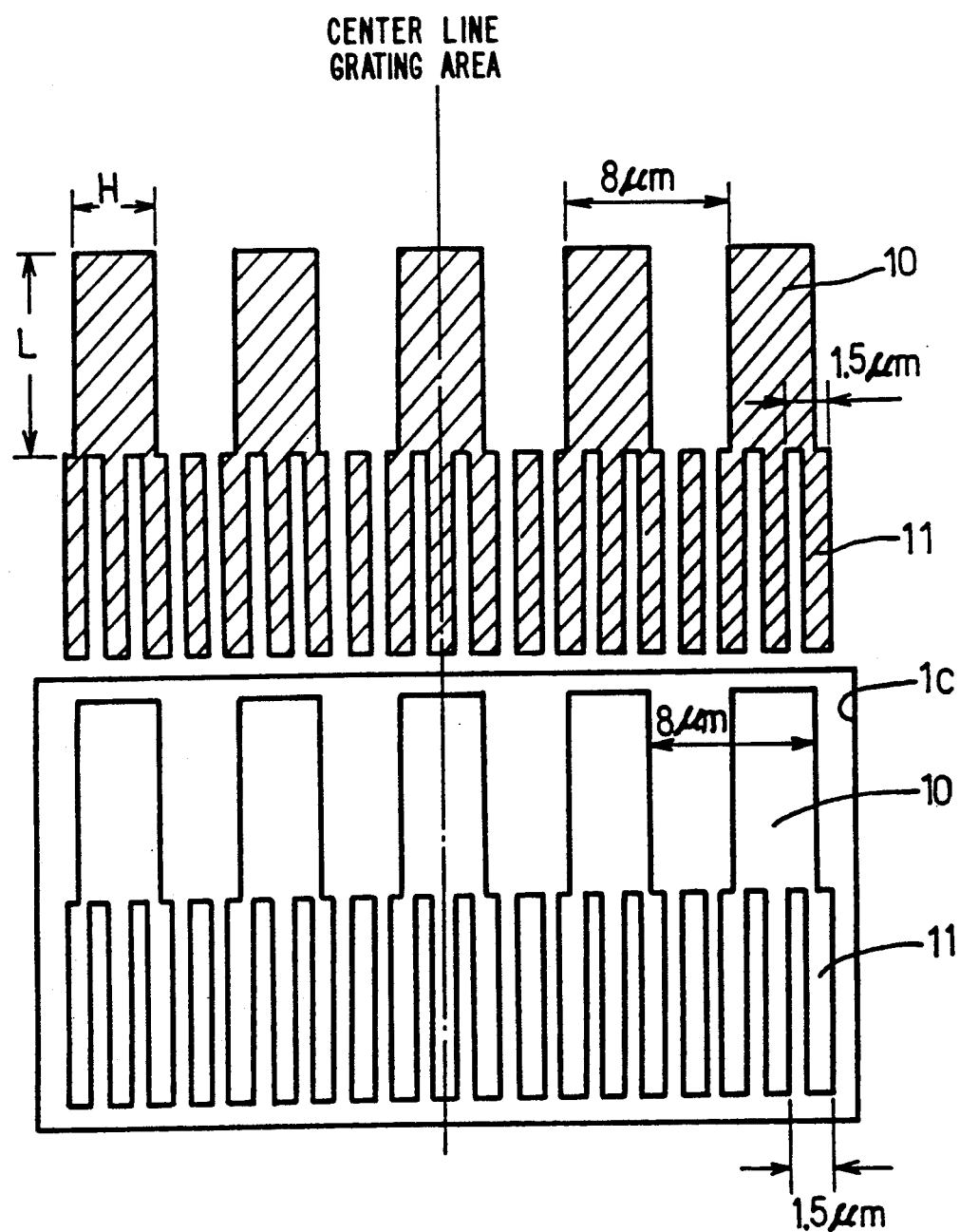
FIG. 12 is plan views of the diffraction gratings of the different grating pitches to be provided on the mask A and the wafer B of the embodiment of FIG. 11.

In the present embodiment, as shown in FIG. 12, the diffraction gratings 10 with 8 μm pitch are arranged in rows at the upper side on the mask A, and the diffraction gratings 11 with 1.5 μm pitch are arranged in column at the lower side on the wafer B.

Other than the above mentioned structure, this embodiment has a light source 2 comprising a stabilized transverse Zeeman laser (STZL) issuing the coherent lights having the two frequency components f1, f2;

a moving mechanism (not shown) composed of a mask stage and a wafe stage;

an injection angle adjusting means composed of the mirrors 30, 31 and the mirrors 32, 33 to conduct the coherent lights, which come from the polarization beam splitters (PBS) 50, 51 after having passed a cylindrical lens 200, a beam splitter 201, and a mirror 202, to the diffraction gratings 10, 11 of the mask A and the wafer B from the ±1st order directions (actually the directions are plural, because the pithces are different);

a light interfering means composed of the polarization beam splitters 50, 51 which divide the coherent lights from the light source 2 into f1 and f2 components, and cause them to enter the mirrors 30, 31, 32, 33, and half wave plates ($\frac{1}{2}\cdot\lambda$ plates) 52, 53 which rotates by 90° the plane of polarization of the lights of f1 component only during getting out from the polarization beam splitters 50, 51 until reaching the mirrors 31, 33;

a detector means comprising a mask P1 detector 600 and a mask P2 detector 601 which detect beat signals of the ±1st order diffracted lights taken out from the diffraction gratings 10, 11 of the mask A side, as beat signals derived from the diffraction gratings 10 with 8 μm pitch and beat signals derived from the diffraction gratings 11 with 1.5 μm pitch via the mirrors 203, 204 and a knife edge mirror 205, as well as a wafer P1 detector 602 and a wafer P2 detector 603 which detect beat signals of the ±1st order diffracted lights take out under interfering conditions from the diffraction gratings 10, 11 of the mask B side, as beat signals derived from the diffraction gratings 10 with 8 μm pitch and beat signals derived from the diffraction gratings 11 with 1.5 μm pitch via mirrors 203, 204 and a knife edge mirror 206; and a stage controller 71 which receives inputs of the beat signals detected by these detectors, and measures phase differences between the beat signals derived from the diffraction gratings 10 with 8 μm pitch of the mask A and the wafer B and phase differences between the beat signals derived from the diffracted lights from the diffraction gratings 11 with 1.5 μm pitch of the mask A and the wafer B, and issues outputs of the control signals to the above mentioned mechanism in accordance with these phase differences.

In the structure of the above mentioned device, the diffraction gratings 10, 11 of the wafer B are slightly shifted along the length direction L of the grating with respect to the diffraction gratings 10, 11 of the mask A. The mask A is furnished with a window 1c through which the coherent light is injected to the diffraction gratings 10, 11 of the wafer B, and the diffracted lights are taken out therefrom. The stage controller 71 is provided with a phase detector (not shown) for indicating the measured phase differences.

A stabilized transverse Zeeman laser (STZL) of the light source 2 issues the coherent lights containing frequency components f1, f2 with the orthogonally crossed planes of polarization respectively. The present device causes to pass said lights through the cylindrical lens 200, and to advance one part of them to the side of the polarization beam splitter 51 by a beam splitter 201 and the other remainder to the side of the other polarization beam splitter 50 thereby, and to divide said coherent lights into the lights of the f1 component and the lights of the f2 component by means of the both polarization beam splitters 50, 51, and further to inject them from the +1st order directions to the diffraction gratings with 8 μm and 1.5 μm pitches provided on the mask A and the wafer B through the mirrors 30, 31 and the mirrors 32, 33. At this time, as seen in FIG. 11, the lights of the f1 component are rotated by 90° in the plane of polarization by the half wave plates 52, 53, and are injected from the ±1st order direction to the diffraction gratings 10, 11 via the mirrors 31, 33. In the present embodiment, since the diffracted lights generated by injection to the diffraction gratings 10 with 8 μm pitch and those generated by injection to the diffraction gratings 11 with 1.5 μm pitch are all generated "vertically" and overlapped, these lights are obliquely injected thereto respectively by changing the injecting angles as illustrated in FIG. 13 which is seen from the real lateral side of FIG. 11 (the condition seen from the lateral side in the length L of the diffraction gratings), so that the diffracted lights may be taken out in such directions in response to the oblique injection angles.

The lights injected as said above interference after having diffracted in the diffraction gratings 10, 11, and are detected as beat signals in the mask P1 detector 600 and the wafer P1 detector 602, as well as in the mask P2 detector 601 and the wafer P2 detector 603 via the mirrors 203, 204 and the knife edge mirrors 205, 206.

Further, the detected beat signals are input to the stage controller 71. The phase differences between the beat signals derived from the diffraction gratings 10 with 8 μm pitch provided on the mask A and the wafer B are measured, and similarly the phase differences between the beat signals derived from the diffraction gratings 11 with 1.5 μm pitch are measured, whereby the amounts of the relative position rotations between the mask A and wafer B are detected respectively. Obtained signal wave shapes are as seen in FIGS. 14(a)(b). The signal wave shape shown in FIG. 14(a) is a linear signal with a 4 μm cycle, and the signal wave shape shown in FIG. 14(b) is a linear signal with a 0.75 μm cycle. Since the phase differences of the beat signals derived from the diffraction gratings 10 with 8 μm pitch of the mask A and the wafer B, and the phase differences of the beat signals derived from the diffraction gratings 11 with 1.5 μm pitch are measured respectively in the stage controller 71, the amounts of the relative position shifts of the mask A and the wafer B can be measured within the 4 μm range, and resolutions of the diffraction gratings 11 with 1.5 μm pitch can be accomplished at the same time (if assuming that the resolution of the phase detector is around 1°, its resolution is 0.75 μm/360°, and this is about 5.3 times of the resolution of the diffraction grating 10 with 8 μm pitch).

Figure 15:
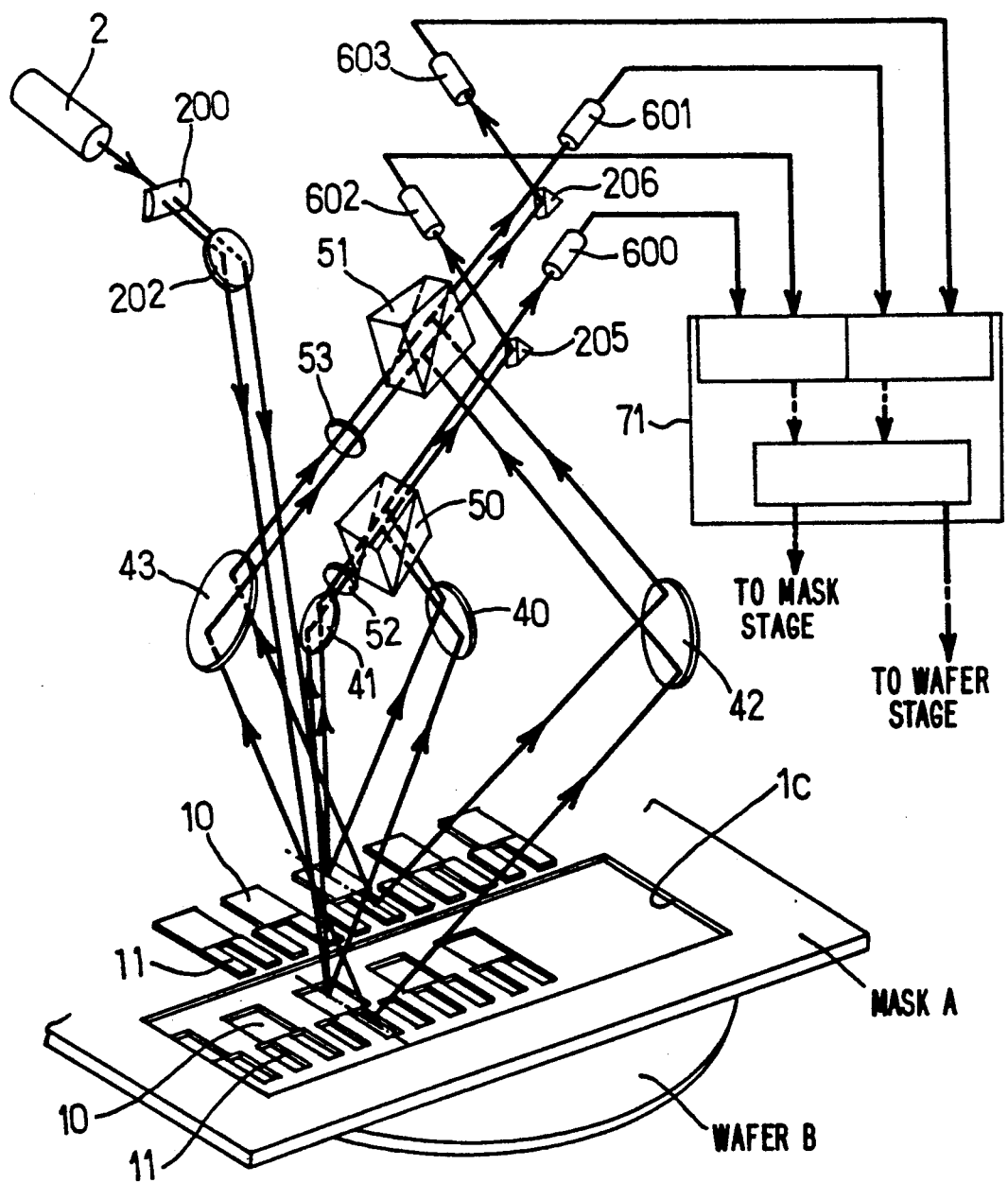
FIG. 15 is a second embodiment of the invention relating to a perspective view showing a structure of one of the embodiments of the position aligning apparatus of the 5th invention.

FIG. 15 shows the structure of a 5th inventive positioning device used to the alignment of the mask A and the wafer B in the exposure device by the use of the synchrotron radiation.

In the structure of the present invention, the diffraction gratings 10, 11 with the 8 μm pitch and the 1.5 μm pitch are positioned in column on the mask A and wafer B.

The present invention has the coherent light source 2 composed of the stabilized transverse Zeeman laser which injects the two frequency coherent lights along the "vertical" direction to the diffraction gratings 10, 11 via the cylindrical lens 200 and the mirror 202;

the moving mechanism (not shown) composed of the mask stage and the wafer stage;

diffracted light taking-out means of the mirrors 40, 41 which take out the ±1st order diffracted lights generated from the diffraction gratings 10 with the 8 μm pitch among the diffracted lights generated from the diffraction gratings 10, 11 by said injecting, and of the mirrors 42, 43 which take out the +1st order diffracted lights generated from the diffraction grating 11 with the 1.5 μm pitch;

a light interfering means composed of half wave plates 52, 53 which rotate by 90° the plane of polarization of the diffracted lights taken out in the +1st order direction by the mirrors 41, 43, and polarization beam splitters 50, 51 where the −1st order diffracted lights taken out by the mirrors 40, 42 interfere with the +1st order diffracted lights having the plane of polarization rotated by 90°;

a detecting means composed of a detector 600 for diffracted lights (±1st order) from a mask gratings P1 (mask P1 detector) and a detector 601 for diffracted lights from a mask grating P2 (mask P2 detector), which detect the beat signals derived from the diffraction gratings 10 on the mask A with the 8 μm pitch and from the diffraction gratings 11 on the mask A with the 1.5 μm pitch respectively, as well as a wafer P1 detector 602 and a wafer P2 detector 603, which reflect the beat signals derived from the diffraction gratings 10 on the wafer B with the 8 μm pitch and from the diffraction gratings 11 on the wafer B with the 1.5 μm pitch respectively, after having been reflected by the knife edge mirros 205, 206; and a stage controller 71 which receives the inputs of the beat signals detected by each of the detectors, measures the phase differences between the beat signals derived from the diffracted lights from the diffraction gratings 10 with the 8 μm pitch on the mask A and the wafer B and the phase differences between the beat signals derived from the diffracted lights from the diffraction gratings 11 with the 1.5 μm pitch on the mask A and the wafer B, and issues outputs of control signals to said moving mechanism in accordance with these phase differences.

The above mentioned device will be used as follows.

The coherent lights including the two frequency components f1, f2 issued from the stabilized transverse Zeeman laser of the light source are injected along the "vertical" direction to the diffraction gratings 10, 11 of the mask A and the wafer B respectively. At this time, to the diffraction gratings 10, 11 on the wafer B, the coherent lights are injected through a window 1c. By this injection, the diffracted lights are generated at the respective diffraction gratings 10, 11 in the respective directions as shown in FIG. 15. The ±1st order diffracted lights issued from the diffraction gratings 10 with the 8 μm pitch on the mask A and the wafer B are reflected by the mirrors 40, 41, while the ±1st order diffracted lights issued from the diffraction gratings 11 with the 1.5 μm pitch on the mask A and the wafer B are reflected by the mirrors 42, 43 towards the polarization beam splitters 50, 51. Therefrom, some parts of the reflected lights reach the mask P1 detector 600 and the mask P2 detector 601, and the remainders reach the wafer P1 detector 602 and the wafer P2 detector 603 via the knife edge mirrors 205, 206, and are detected there. Among the above mentioned diffracted lights, the ±1st order diffracted lights which are reflected by the mirrors 41, 43 and issued from the diffraction gratings 10, 11 with the 8 μm pitch and the 1.5 μm pitch of the mask A and the wafer B, are rotated by 90° in the plane of polarization by half wave plates 52, 53 (that is, a vertical plane is converted to the horizontal one, or a horizontal plane is rotated to a vertical one), and these lights interfere with the −1st order diffracted lights which are taken out from the diffraction gratings 10, 11 with the 8 μm pitch and the 1.5 μm pitch by means of the poralization beam splitters 50, 51. The beat signals generated by the intereference are detected at the detectors 601 to 604, and sent to the stage controller 71 which measures the phase difference between the beat signals sent from the mask P1 detector 600 and the beat signals sent from from the wafer P1 detector 602. In the present embodiment, the signal wave shapes as shown in FIG. 14(a) are provided. Similarly, the stage controller 71 measures the phase difference between the beat signal sent from the mask P2 detector 601 and the beat signals sent from the wafer P2 detector 603. The signal waver shapes as shown in FIG. 14(b) are provided.

Figure 16:
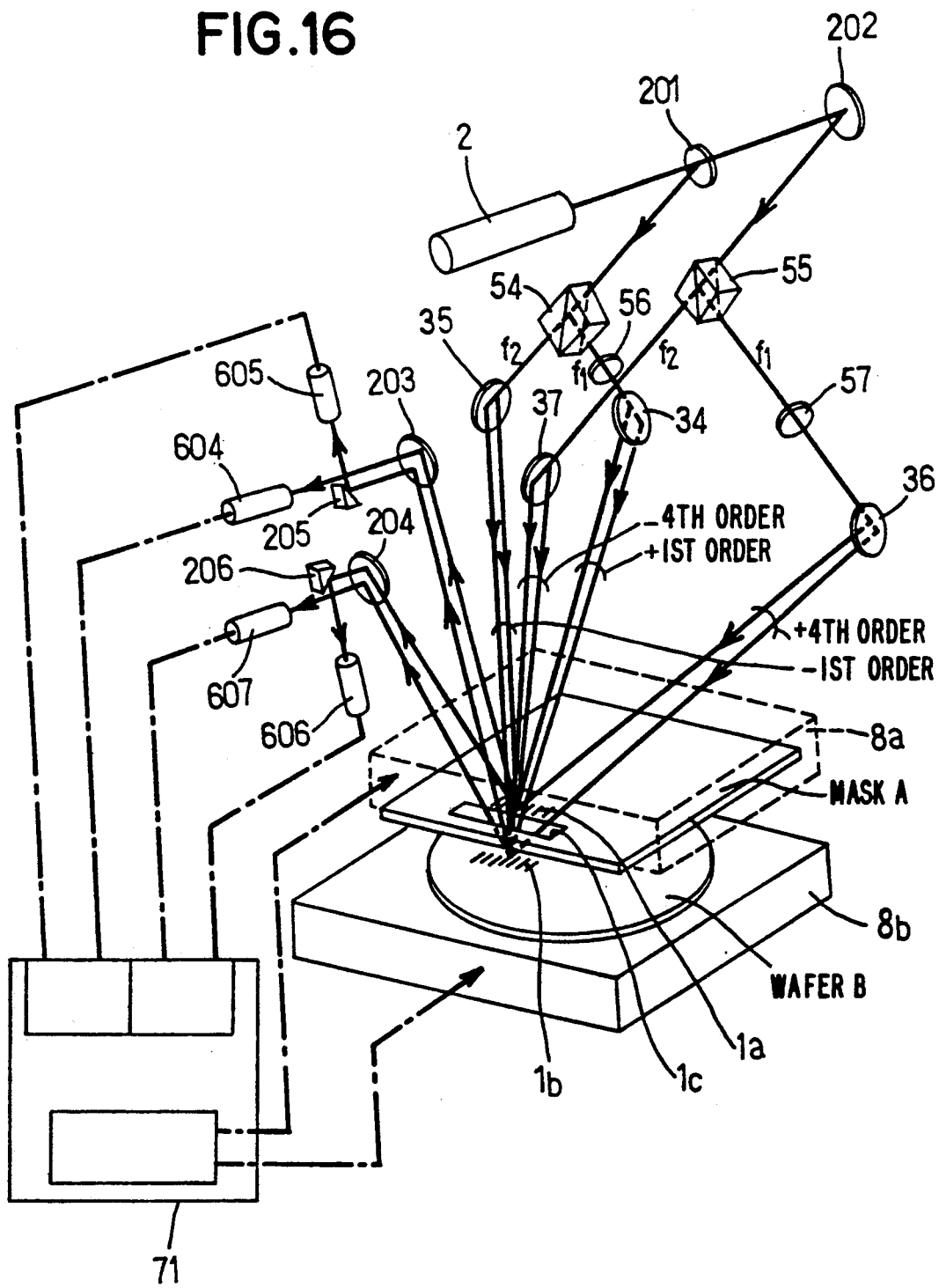
FIG. 16 is a third embodiment of the invention relating to a perspective view showing a structure of the position aligning apparatus of the 15th invention.

On the other hand, FIG. 16 illustrates an embodied structure of a position aligning device of a 15th invention which was used to the position aligning of the mask A and the wafer B in the exposure device by the use of the synchrotron radiation.

Figure 17:
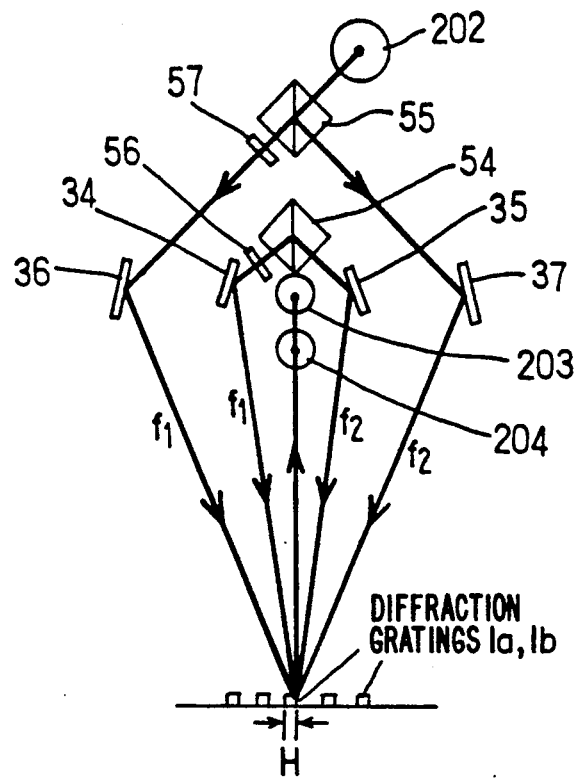
FIG. 17 is a front view showing that of the diffracted lights are taken out in the width direction H of the diffraction gratings of the above mentioned embodiment.
Figure 18:
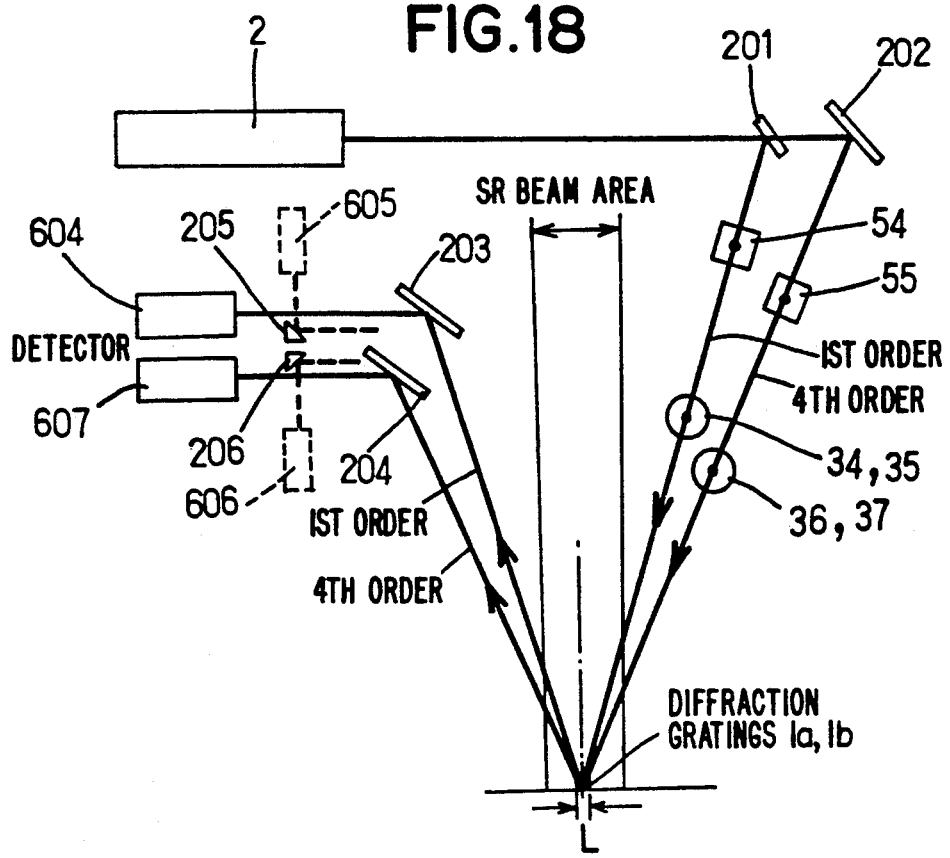
FIG. 18 is a side view showing that the diffracted lights are taken out, seen from the real lateral side in the length direction L of the diffracted gratings in this embodiment.

In the present embodiment, some parts of the coherent lights having the two frequency components f1, f2 issued from the light source 2 of the stabilized transverse Zeeman laser are advanced to the polarization beam splitter 54 by the beam splitter 201, and the remainders are advanced to the other polarization beam splitter 55 via the mirror 202. Said coherent lights are divided by the both polarization beam splitters 54, 55 into lights having the f1 component and lights having the f2 component, and injected from the ±1st order directions and the ±4th order directions to the mask diffraction gratings 1a and the wafer diffraction gratings 1b by the mirrors 34, 35 and the mirrors 36, 37 respectively As seen in FIG. 17, the lights having the f1 component are rotated by 90° in the plane of polarization by the half wave plates 56, 57, and are injected from the +1st order direction and the +4th order direction to the diffraction gratings 1a, 1b by the mirrors 34, 36. Since the diffracted lights generated by the injection from the ±1st order directions and the diffracted lights generated by the injection from the ±4th order directions are also effected along the "vertical" direction and superpose each other, said injections in the ±1st order directions and the ±4th order directions are obliquely provided by varying the injection angles as seen in FIG. 18 showing a condition seen from the real lateral side of FIG. 17, so that the diffracted lights may be taken out in directions in response to the obliquely injecting angles (which may be detected in the oblique direction).

The light injected as mentioned above interfere after having been diffracted, and are detected as the beat signals by a mask 1st order detector 604 (photo detector for a 1st order diffracted lights from the mask gratings) and a wafer 1st order detector 605 as well as a mask 4th order detector 606 and a wafer 4th order detector 607 via the mirrors 203, 204 and the knife edge mirrors 205, 206.

Figure 19:
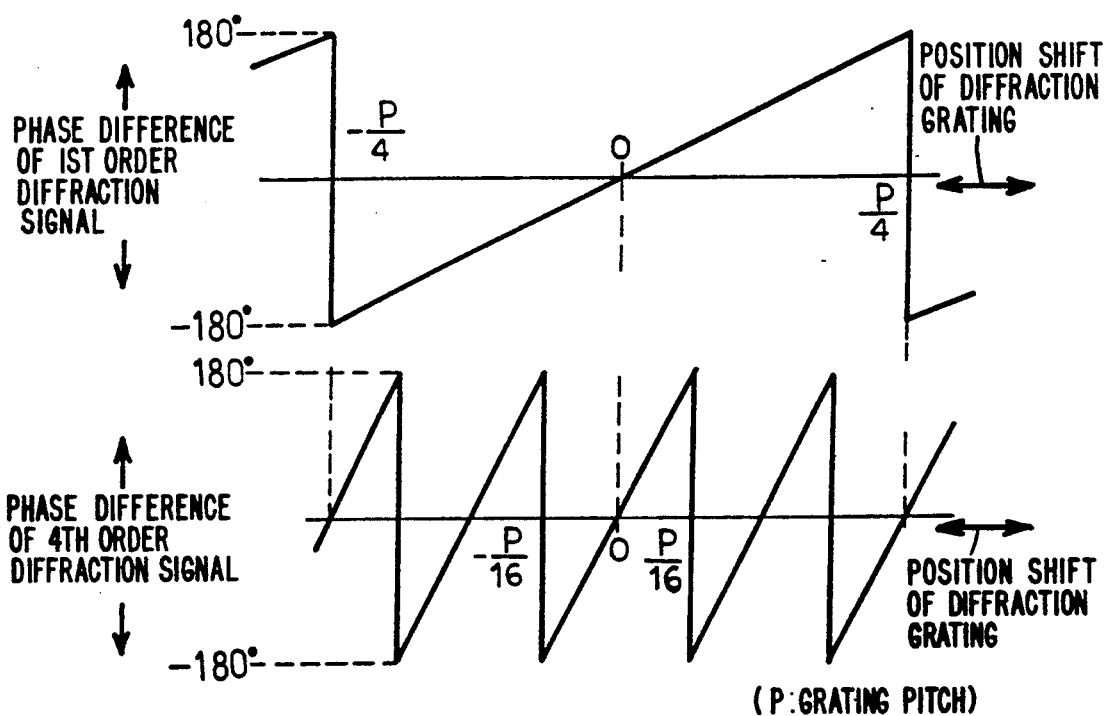
FIGS. 19(a)(b) show waves of the beat signals obtained by the structure of the 3rd embodiment.

The detected beat signals are sent to the stage controller 71 so as to measure the phase differences of the beat signals derived from the ±1st order injection lights and those of the beat signals derived from the ±4th order injection lights, and measure the amounts of relative positional shifts between the mask A and the wafer B. Obtained signal wave shapes are as shown in FIGS. 19(a) (b). The signal wave shape of FIG. 19(a) is a linear signal having a period of ½ pitch of the diffraction gratings, and that of the FIG. 19(b) is a linear signal having a period of ⅛ pitch of the same. Since the stage controller 71 detects the phase differences of the beat signals derived from the ±1st order diffracted lights and those derived from the ±4th order diffracted lights, it is possible to measure the amounts of relative positional shifts between the mask A and the wafer B within the range of the ⅛ pitch, and resolution of the ±4th order diffrafred lights may be accomplished at the same time (if assuming that the resolution of the phase detector is around 1°, said resolution is (P/8)/360°, and this is 4 times of the resolution of the ±1st diffracted lights).

Figure 20:
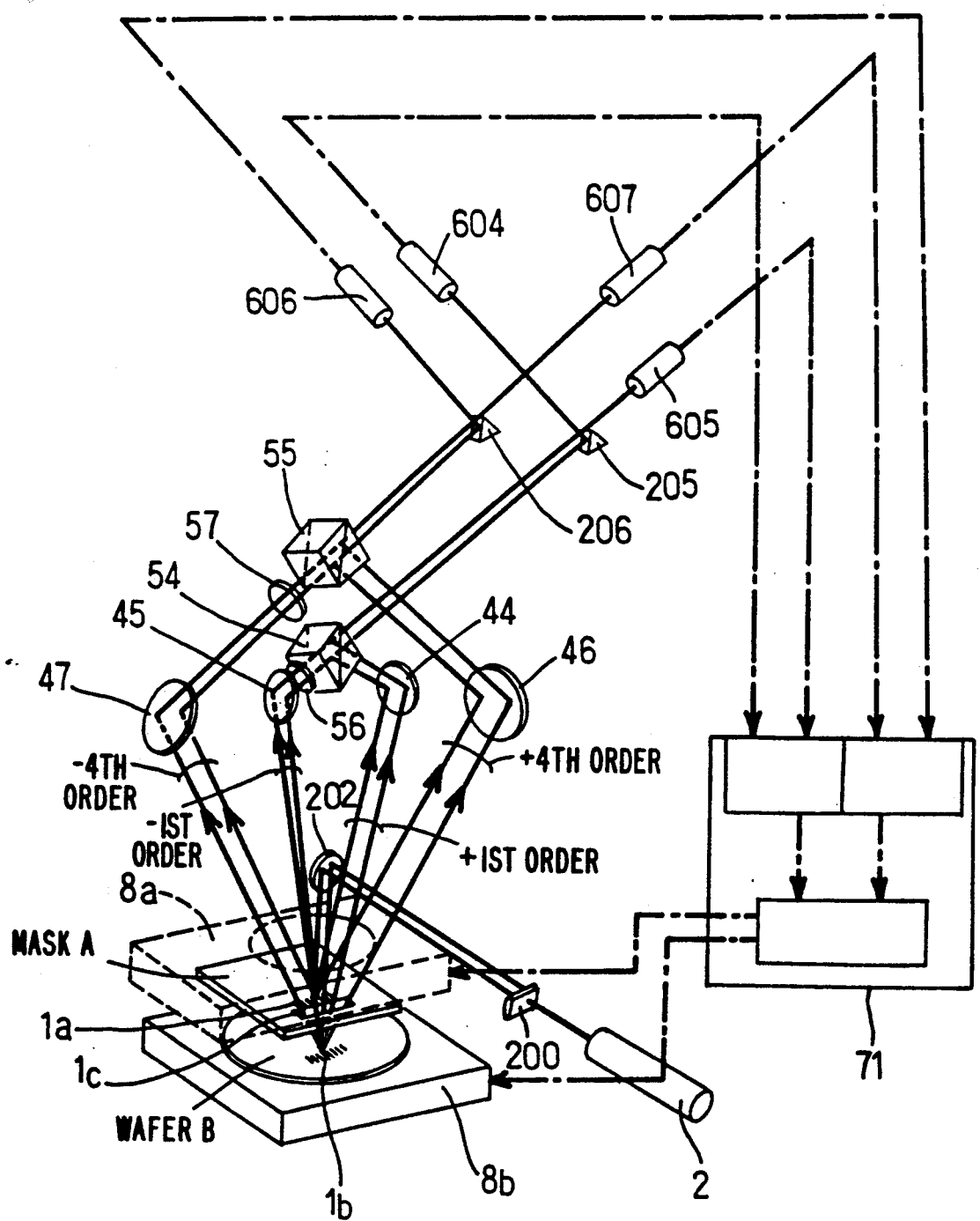
FIG. 20 is a perspective view showing a structure of the position aligning apparatus of the 16th invention.

FIG. 20 illustrates the outlined view of the structure of a position aligning device relating to a 16th invention used to the alignment of the mask A as the 1st substance and the wafer B as the 2nd substance in the exposure device by the use of the synchrotron radiation. With respect to the moving mechanisms of the mask and the wafer, FIG. 20 only shows a mask stage 8a and a wafer stage 8b without showing other structures.

Figure 21:
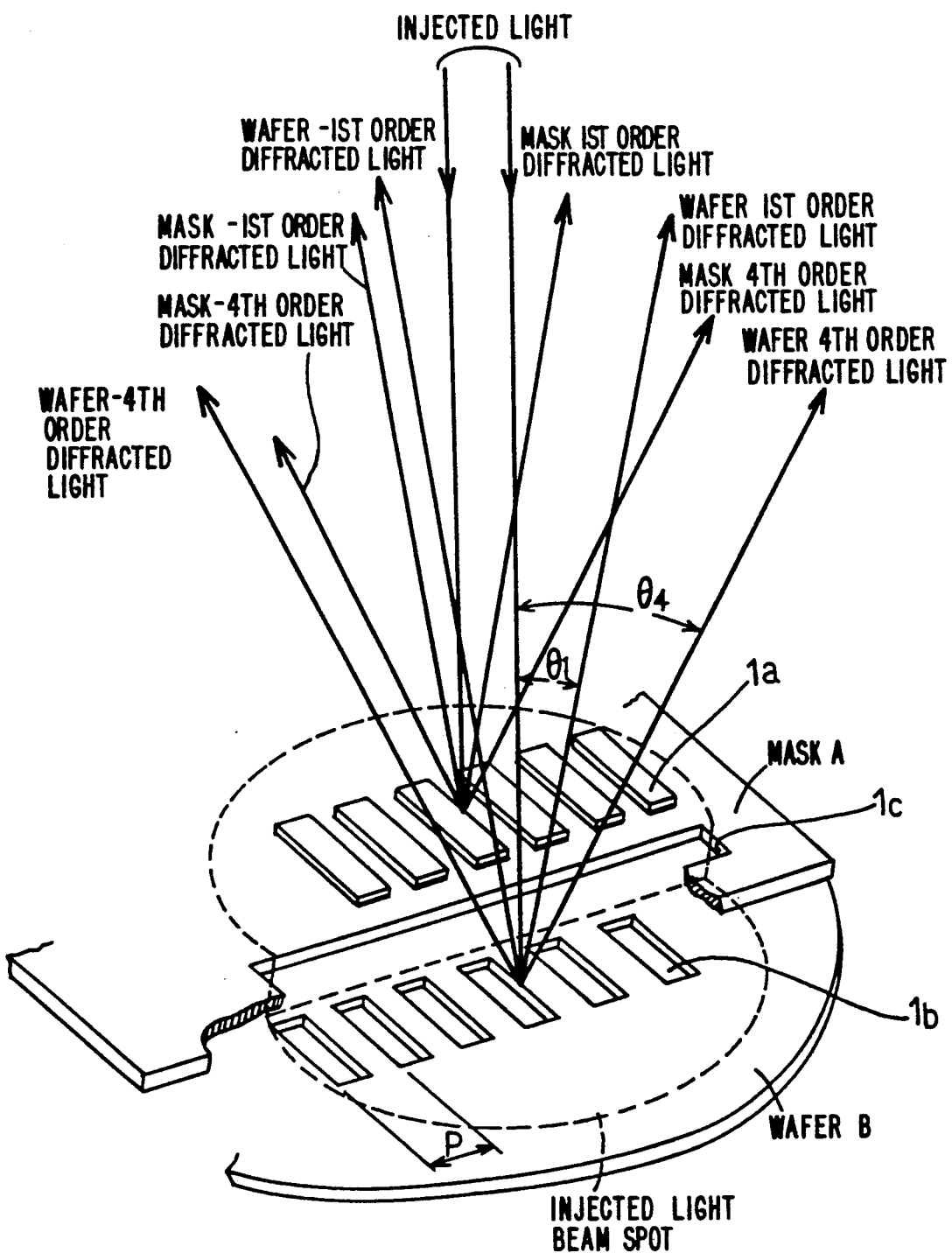
FIG. 21 is a perspective view showing injections and diffraction of the coherent lights of this embodiment.

In this embodiment, as seen in FIG. 21, the two frequency coherent lights are injected from the light source 2 comprising the stabilized transverse Zeeman laser toward the diffraction gratings 1a, 1b along the "vertical" directions. Among various ±n-th order diffracted lights, the diffracted lights of the ±1st order and those of the ±4th order are taken out by the diffracted light takeing-out means of the mirrors 44, 45 and 46, 47. For providing the interference of the diffracted lights, the planes of polarization of the diffracted lights taken out in the −1st order and the −4th order directions by the mirrors 45, 47 are rotated by 90° by the half wave plates 56, and the diffracted lights taken out in the +1st order and the +4th order directions by the mirrors 44, 46 interfere with said −1st order and said −4th order diffracted lights having been rotated by 90° through the polarization beam splitters 54, 55. The ±1st and ±4th order diffracted lights which are taken out from the diffraction gratings on mask 1a (mask grating) are reflected by the knife edge mirrors 205, 206, and received by a mask 1st order detector 604 (photo detector for a 1st order diffracted beam from the mask grating) and a mask 4th order detector 606 as the beat signals derived from the ±1st order diffracted lights and the ±4th order diffracted lights.

On the other hand, the ±1st order and ±4th order diffracted lights taken out from the wafer diffraction gratings 1b are also received by a wafer 1st order detector 605 (photo detector for a 1st order diffracted beam from the mask grating) and a wafer 4th order detector 607 so as to detect the beat signals derived from the ±1st and ±4th order diffracted lights. These beat signals are issued to an input of the stage controller 71 and the phase differences are measured between the beat signals derived from the ±1st order diffracted lights and the phase difference between the beat signals derived from the ±4th order diffracted lights, and in accordance with those phase differences control signals are output to the mask stage 8a and/or the wafer stage 8b.

Then, at the stage controller 71, the same signal wave shapes as shown in FIG. 19(a) are provided by measuring the phase differences of the beat signals sent from the mask 1st order detector 604 and from the wafer 1st order detector 605. Similarly at this stage controller 71, the same signal wave shapes as shown in FIG. 19(b) are provided by measuring the phase differences of the beat signals sent from the mask 4th order detector 606 and from the wafer 4th order detector 607.

With respect to the diffraction gratings used in the embodiments explained hereinbefore, the cross sections of the grating is rectangular. On the other hand, the diffraction gratings with an isosceles triangular cross section (brazed grating) of the 7th, the 17th and 18th inventions may be also used. The inventor made experiments as to how the strength of the diffracted lights are improved by using said brazed gratings.

The inventor provided, on a mask as a first substance, the the diffraction gratings composed of the brazed grating having 4 μm grating pitches and an isosceles triangular cross section, and applied them to a device having a structure as will be mentioned for performing comparison experiments on the strength of the diffracted lights with a case using a phase gratings with the rectangular cross section.

Figure 22A:
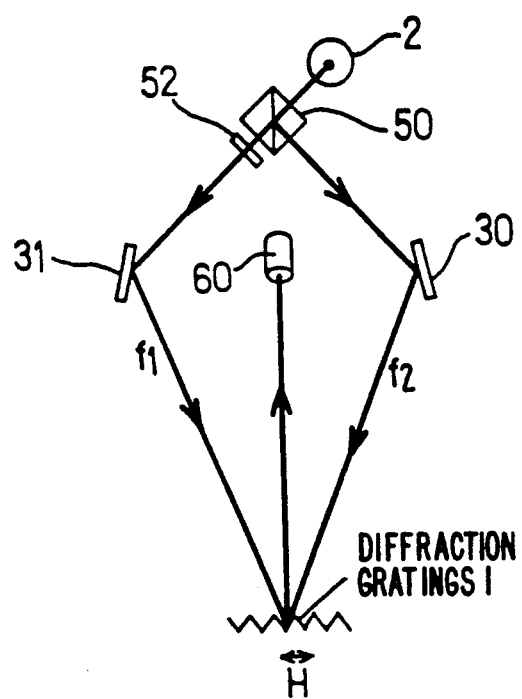
FIG. 22(a) is a front view showing an experimental apparatus for comparing strength of the diffracted lights of the brazed gratings to be used in the structures of the 6th, 7th and the 17th and 18th inventions.
Figure 22B:
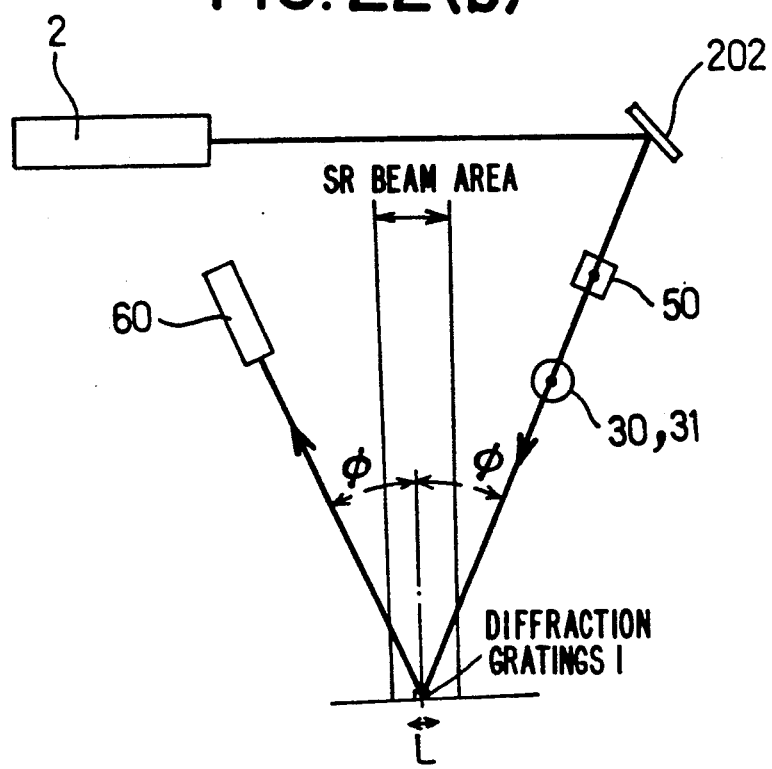
FIG. 22(b) is a side view of the above.

That is, a He-Ne stabilized transverse Zeeman laser was used for the light source 2, and the two frequency components f1, f2 of the laser lights were branched by the polarization beam splitter 50 as shown in FIGS. 22(a)(b). The thus branched respective lights were made to be +1st order injection lights and −1st order injection lights by the mirrors 30 and 31 and were injected to the diffraction gratings 1 obliquely with the oblique angle ($\phi$) of 10°. The injection angle $\theta$1 could be calculated from the above mentioned relation (5) by using $\lambda = 0.6328$ μm, $P = 4$ μm, $\phi = 10°$ and $n = 1$, and was 9.24°.

The brazed angle $\alpha b$ could be calculated from the relation (3), and was 4.62°. In this example, the brazed grating with the isosceles triangular cross section processed to be a brazed angle $\alpha b = 4.62°$ was used as one of types of the diffraction gratings.

| Diffraction grating | Strength of diffracted lights |
|---|---|
| Isosceles triangular cross section | 0.7 |
| Rectangular cross section | 0.1 |

It is seen from this table that when the isosceles triangular cross section were used as the diffraction gratings, the strength of the diffracted lights is 7 times in comparison with the case where rectangular cross section grating was used.

It may be assumed from the above experimented results that if the brazed grating is used to the 1st and 2nd diffraction gratings of the 1st and 2nd substances, the strength of specific diffracted lights only may be heightened, so that it is possible to considerably improve the S/N ratio of the signal to be finally detected as the beat signals. Therefore, if applying the brazed gratings to the above mentioned structures which enable the both of the wide detecting region and the high detecting resolution by injecting the coherent lights along not less than the two ±n-th order injecting directions with different absolute values n and detecting the lights diffracted "vertically", or by injecting the coherent lights "vertically" and detecting the diffracted lights along not less than two ±n-th order diffracting directions with the different absolute values n, the accuracy of the detecting resolution is made further higher.

Since the diffraction taking-out structures are complicated in the examples stated hereinbefore, those are simplified by a 19th invention so that the position aligning device in the exposure device is miniaturized. An explanation will be made to the structure of the example.

Figure 23A:
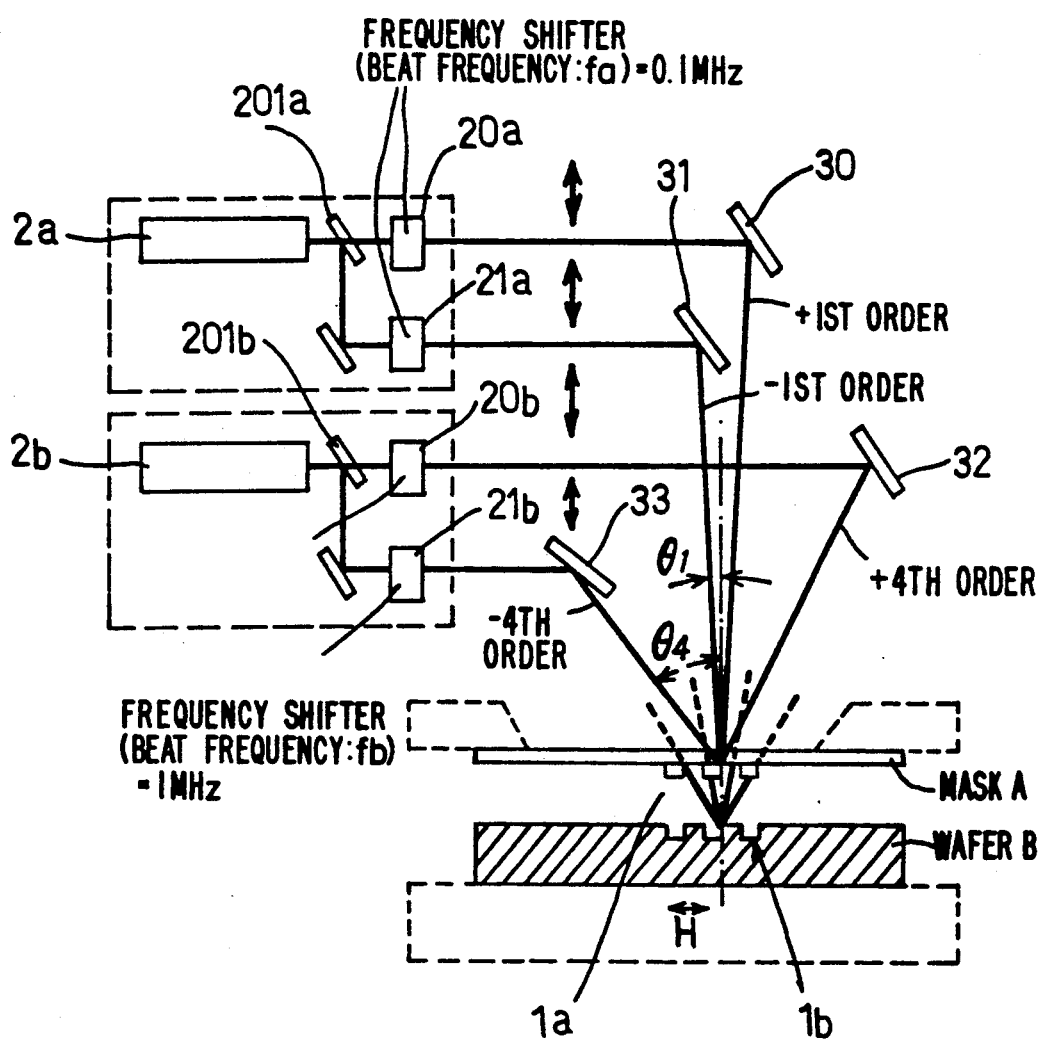
FIG. 23(a)(b) are explanatory views showing structures of the position detecting method according to the 19th invention.
Figure 23B:
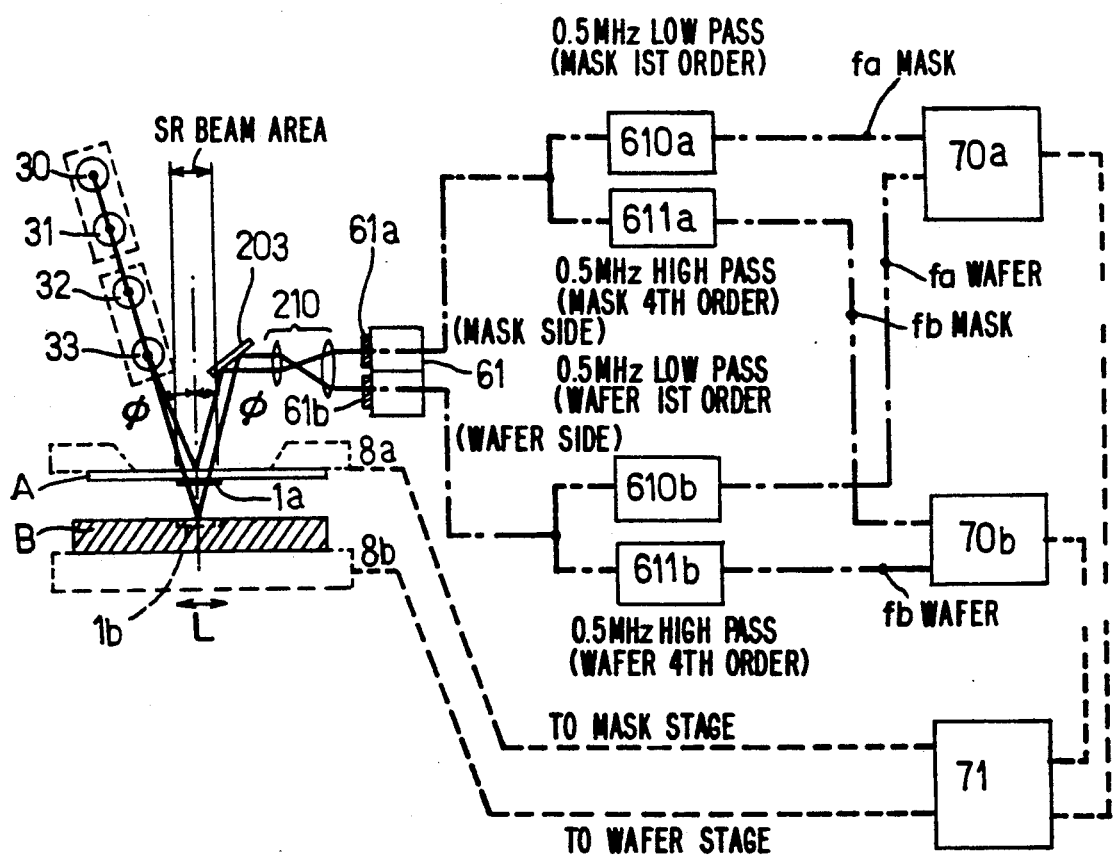

As shown in FIG. 23(a), the coherent lights from a compact laser source 2a composed of a laser diode (or He-Ne laser is also sufficient) are divided into half by a beam splitter 201a, and two linearly polarized lights with the beat frequency being fa=0.1 MHz (if the frequencies of these two lights are f1 and f2 respectively, fa may be obtained with a relation of fa=|f1−f2|) are prepared by means of acoust-optic frequency shifters 20a, 21a (the two shifters are used in FIG. 23(a), but only one of the frequencies may be shifted). The planes of polarization of these coherent lights are parallel each other. Said two lights are injected from the ±1st order directions (angle θ1) toward the diffraction gratings 1a, 1b with the pitch P formed on the mask A and the wafer B as the 1st and 2nd substances through the mirrors 30, 31 (at this time the injection is performed at the oblique angle φ as seen in FIG. 23(b)).

Similarly, the light from the other laser light source 2b (the lights may be divided through a beam splitter (not shown) from said light source 2a) is divided into half by a beam splitter 201b, and two linearly polarized lights with the beat frequency being fb=1 MHz are prepared by means of acoust-optic frequency shifters 20b, 21b. The two lights are, as shown in FIG. 23(b), injected with the same oblique angle φ toward the diffraction gratings 1a, 1b with the pitch P formed on the mask A and the wafer B from the ±4th order directions (angle θ4) through the mirrors 32, 33.

The diffracted lights from the both diffraction gratings 1a, 1b of the mask A and wafer B interfere so as to generate the beat signal, having beat frequencies of fa and fb, and are all diffracted "vertically" with the same angle as said oblique angle φ. These diffracted lights are enlarged to desired scales by beam expanders 210, and divided into mask signals and wafers signals by a two segment photo diode 61.

Figure 9A:
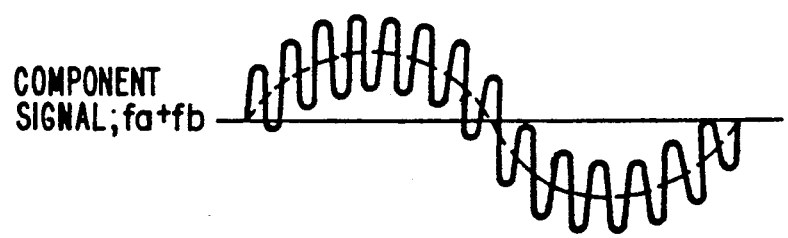
Figure 9B:
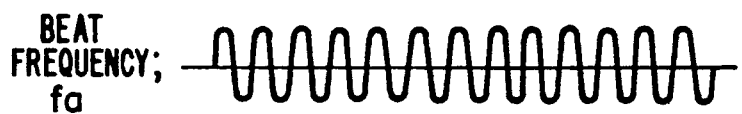
Figure 9C:
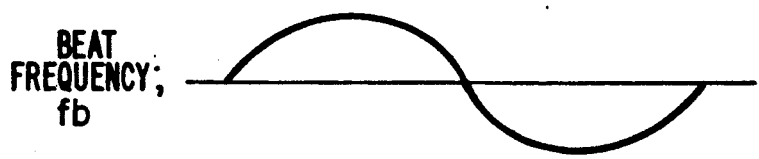
Figure 10A:
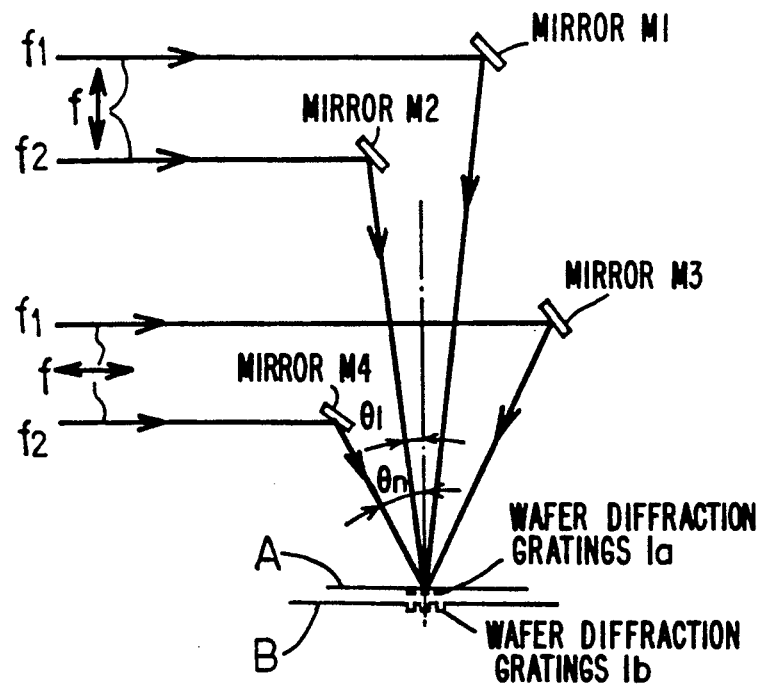
FIG. 10(a)(b) are explanatory views showing basic signal detecting structures of the 10th, 11th and the 21st, 22nd inventions.
Figure 10B:
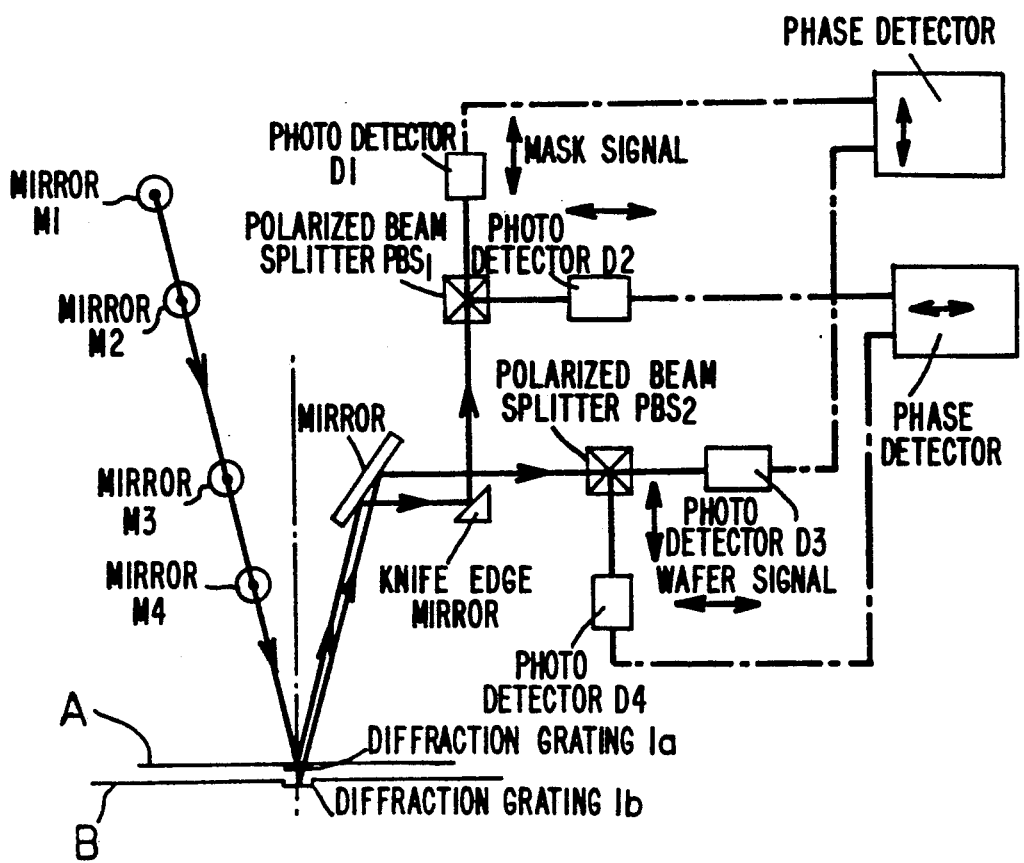

An electric signal detected at a mask signal receiving part 61a in signal receiving parts (detector) of the two segment photo diode 61 includes the beat signals of the two beat frequencies fa, fb as seen in FIG. 9(a). The beat signal is branched into two, and each of them is filtered through a low pass filter 610a and a high pass filter 611a having a threshold frequency f=0.5 MHz which satisfies a condition of fb<f<fa. The signals taken out from the low pass filter 610a are the ±1st order mask signals of the beat frequency fb without the fa component as shown in FIG. 9 (c). The signals taken out from the high pass filter 611a are the ±4th order mask signals of the beat frequency fa without the fb component as shown in FIG. 9(b).

The electric signal detected at a wafer signal receiving part 61b of the two segment photo diode 61 also includes the two beat frequencies fa, fb. These signals are branched into two, and each of them is filtered through a low pass filter 610b and a high pass filter 611b having the threshold frequency of f=0.5 MHz. The signals taken out from the low pass filter 610b are the ±1st order wafer signals of the beat frequency fb without the fa component. The signals taken out from the high pass filter 611b are the ±4th order wafer signals of the beat frequency fa without the fb components.

The thus obtained ±1st order mask signals and ±1st order wafer signals, and further the ±4th order mask signals and ±4th order wafer signals are sent to the phase detectors 70a, 70b so as to measure the respective phases. By detecting the phase signals of the ±1st and ±4th order concurrently, a wide detecting range by the ±1st order lights can be covered, and a high resolution by the ±4th order lights can be accomplished simultaneously.

Further, if the values detected here are sent to the stage controller 71 as shown with dotted lines in FIG. 23b, and fed back to the mask stage 8a and the wafer stage 8b as the 20th invention, it is possible to align the positions of the mask A and the wafer B.

Figure 24:
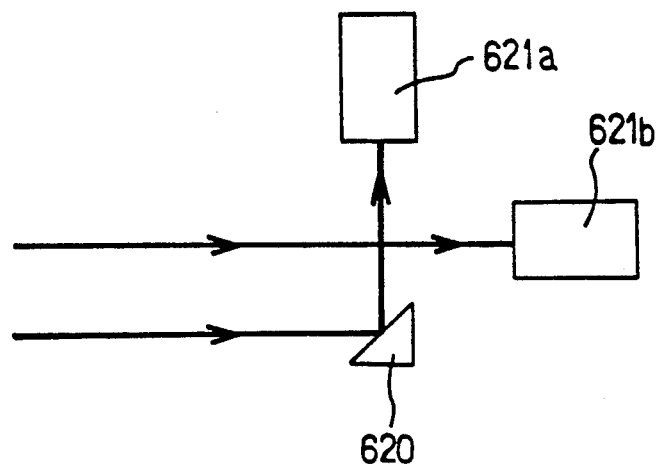
FIG. 24 is an explanatory view showing one of examples of light receiving structures which may be applied to two divisional sensor used in this embodiment.
Figure 25:
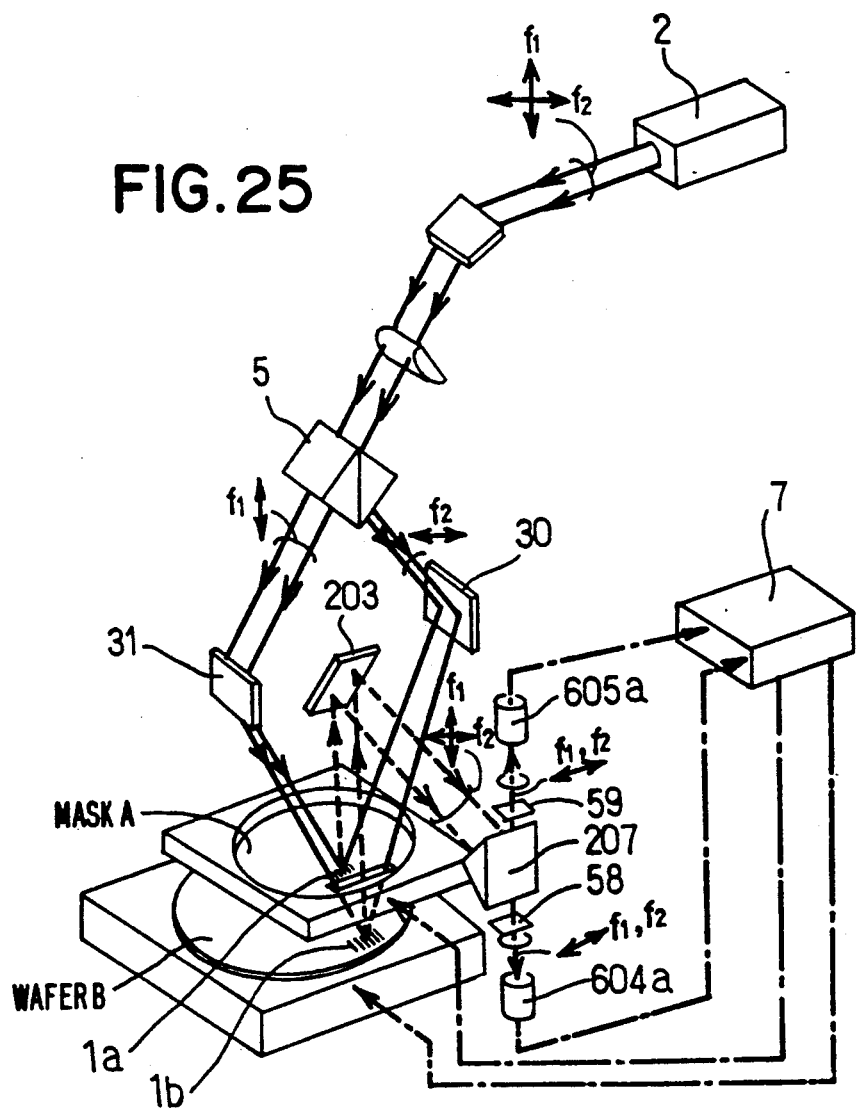
FIG. 25 is an explanatory view showing a conventional light heterodyne position detecting system.
Figure 26:
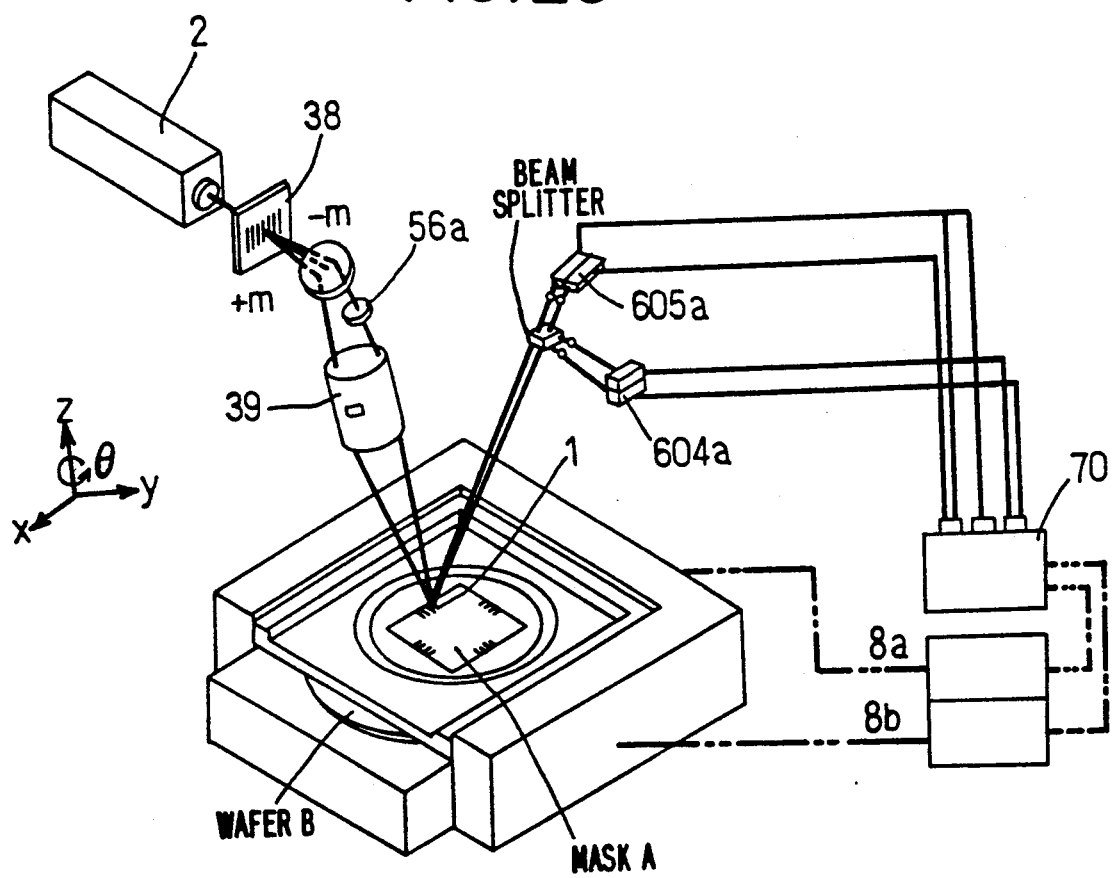
FIG. 26 is an explanatory view showing a conventional light heterodyne position detecting system using a reference gratings and a Fourier transformation optical system.

The diffracted lights can be received, instead of using the two segment photo diode 61, by utilizing the knife edge mirror 620 and photo detectors 621a, 621b as shown in FIG. 24. However, since the two segment photo diode 61 has a non-sensitive zone between the two signal receiving parts 61a, 61b so that cross talk is decreased when seperating the diffracted lights from the mask side and the wafer side, the structure of the device may be made compact by the two segment photo diode 61.

With respect to the light source other than the stabilized transverse Zeeman laser used in the above mentioned embodiments, a combination of an axial Zeeman laser and a ¼ wave plate, and a combination of a stabilized laser and a frequency shifter are available. Those used in the above embodiments convert into the beat signals the diffracted lights obtained from the mask diffraction gratings and the wafer diffraction gratings so as to measure the phase differences of the beat signals. The displacing amounts of the mask and the wafer obtained thereby are relative, but if generating and applying the reference beat signals to the above mentioned embodiments, it is possible to employ the detector of the displacement of the absolute position for measuring how much the mask and the wafer are displaced.

Figure 1:
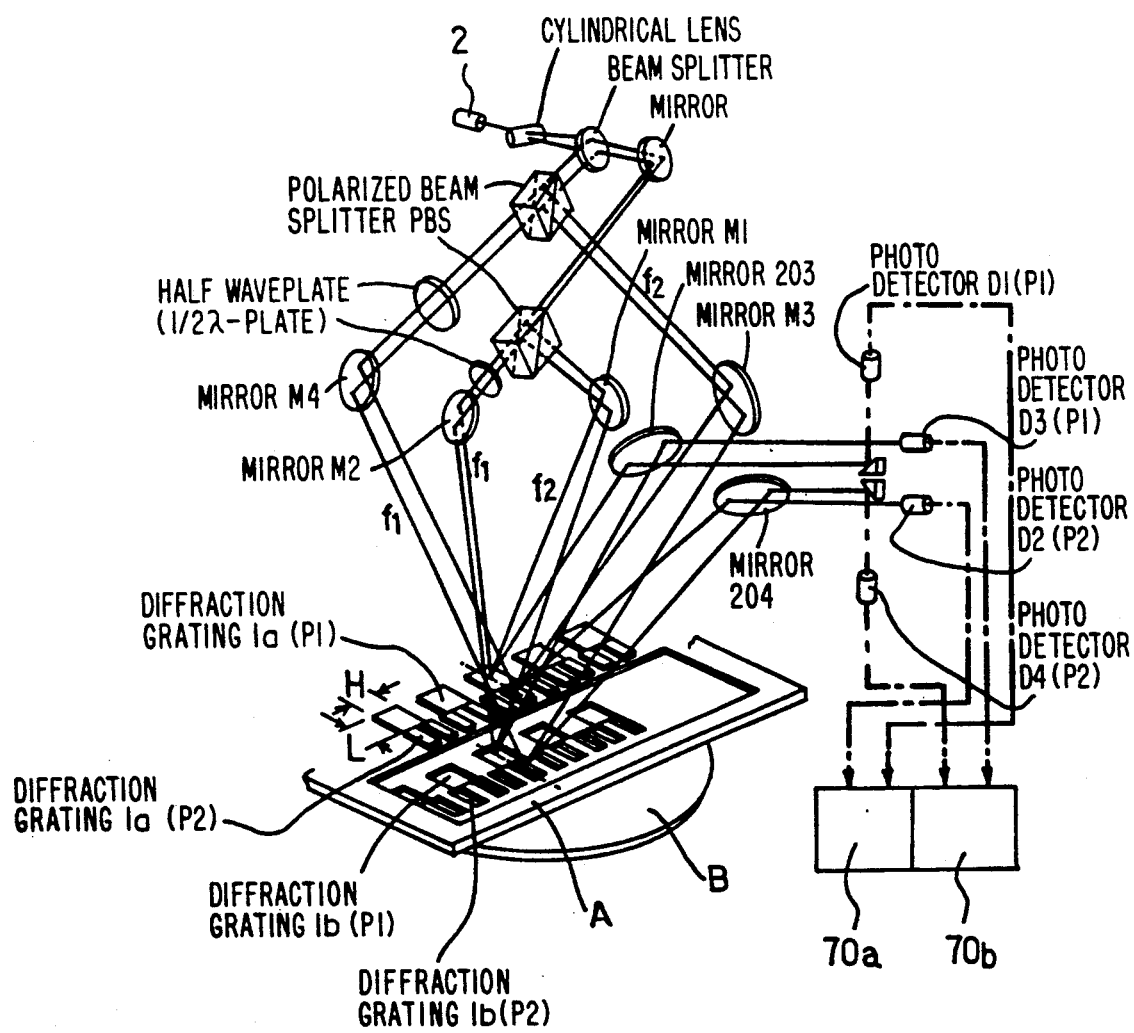
FIG. 1 is a perspective view showing a position detecting structure according to the 1st invention.
Figure 2:
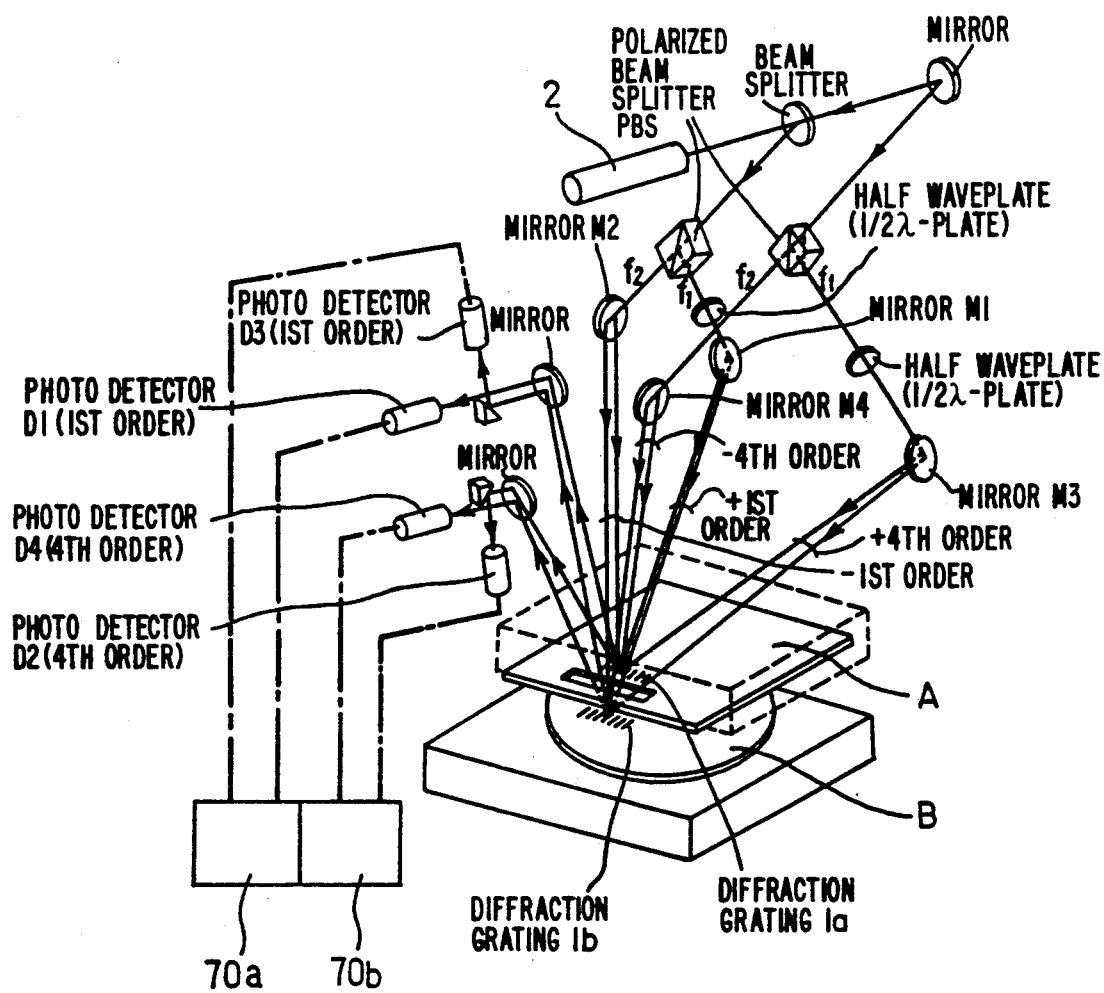
FIG. 2 is a perspective view showing a position detecting structure according to the 12th invention.
Figure 3A:
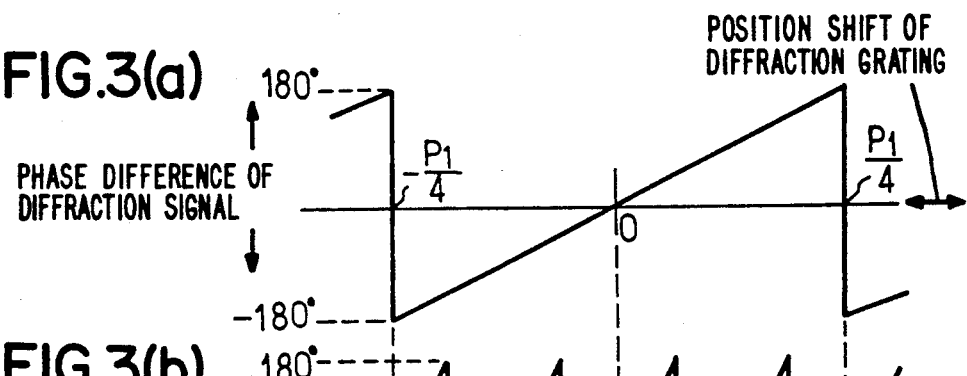
FIGS. 3(a)(b) are beat signal waves obtained by the 1st invention.
Figure 3B:
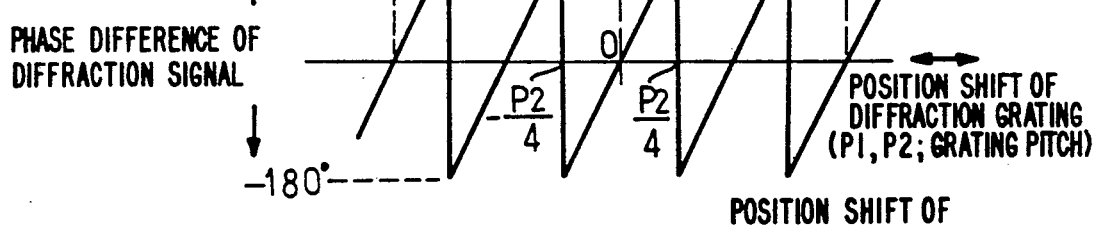
FIGS. 3(c)(d) are beat signal waves obtained by the 12th invention.
Figure 3C:
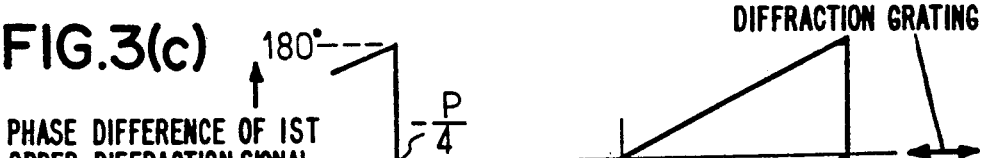
Figure 3D:
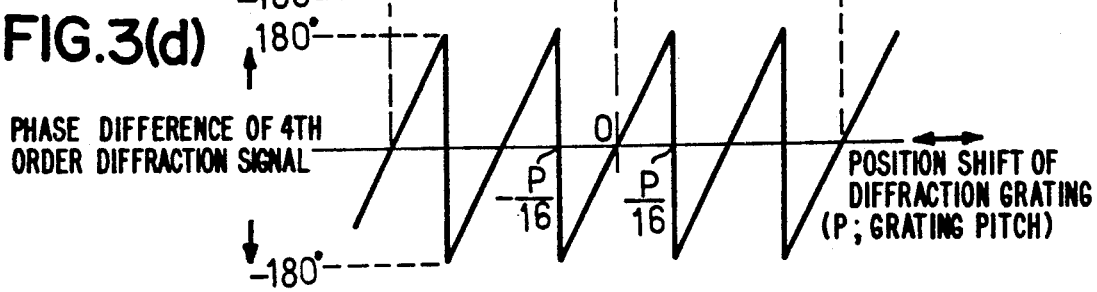
Figure 4A:
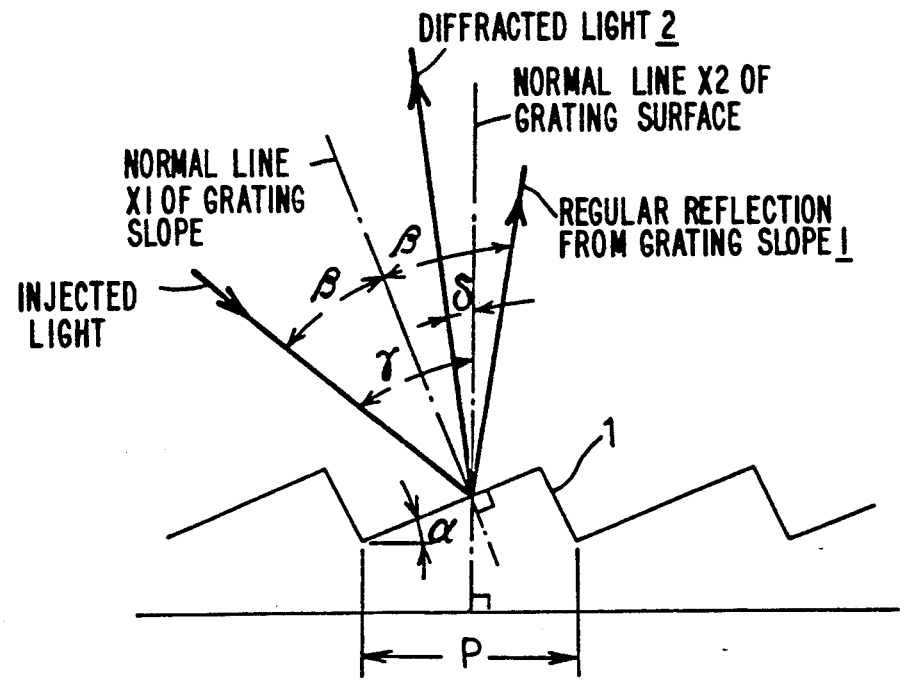
FIGS. 4(a)(b) are explanatory views of principles of the 6th, 7th and the 17th, 18th inventions.
Figure 4B:
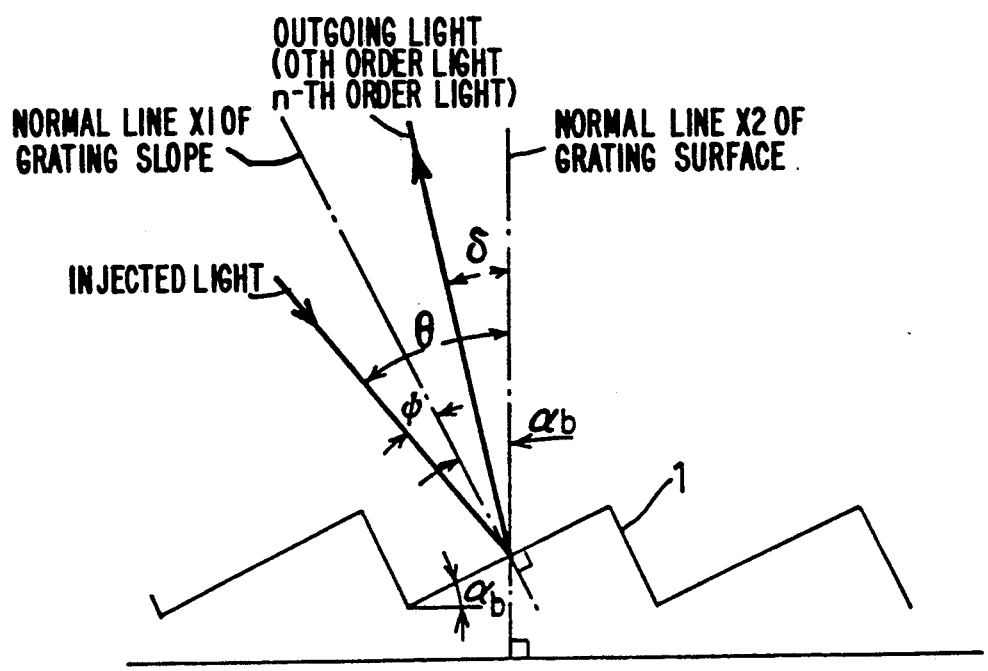
Figure 5:
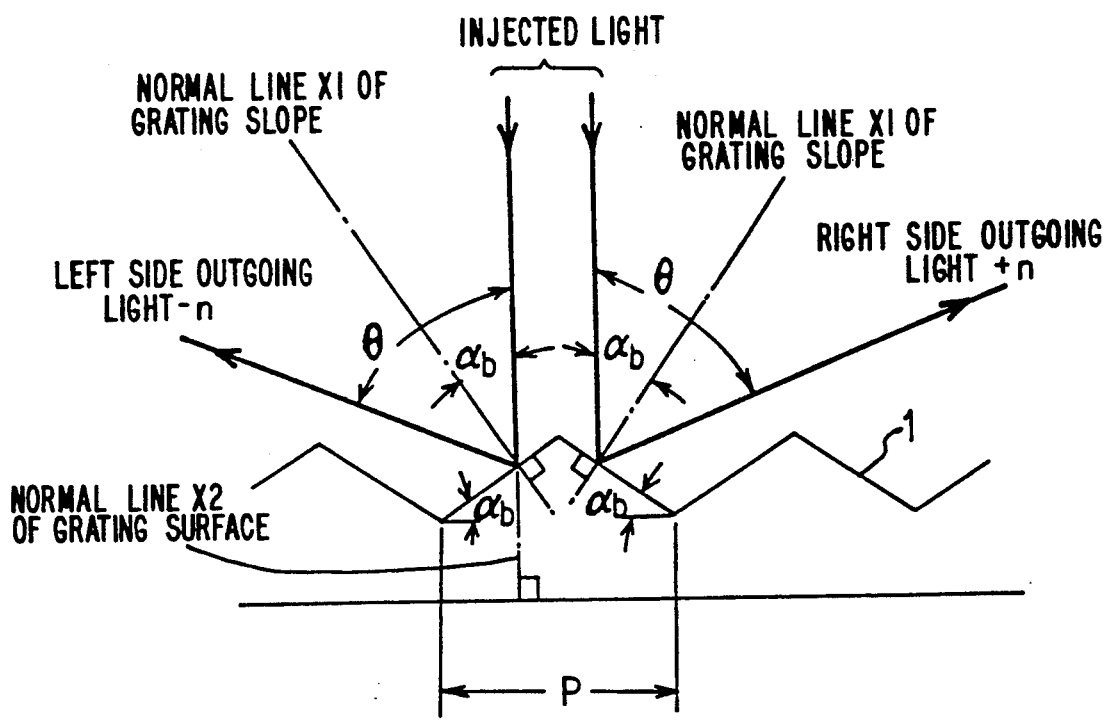
FIG. 5 is a cross sectional view of the diffracted gratings composed of the brazed gratings.
Figure 6:
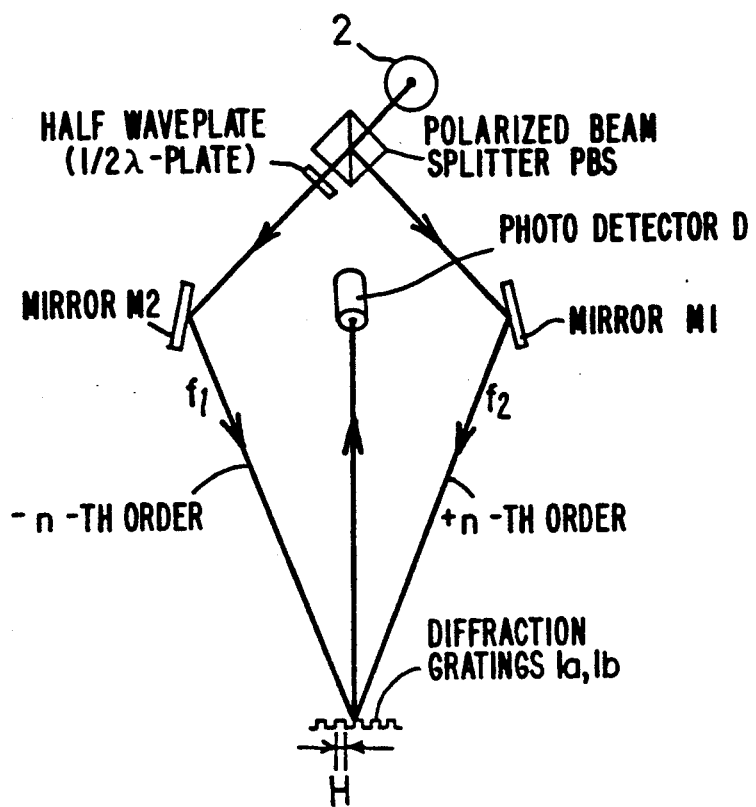
FIG. 6 is a front view showing that the diffracted lights are taken out in the direction L of the diffraction gratings.
Figure 7A:
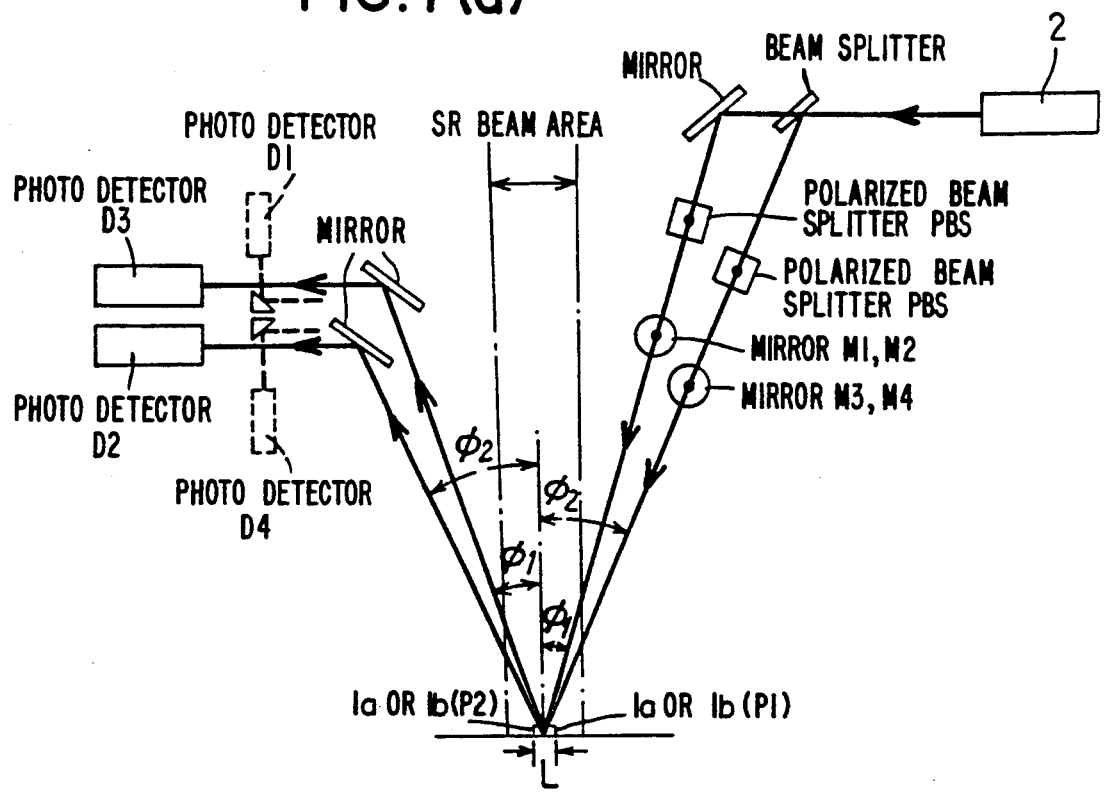
FIG. 7(a)(b) are side views showing that the diffracted lights are taken out, seen from the real lateral side in the direction H of the diffraction gratings.
Figure 7B:
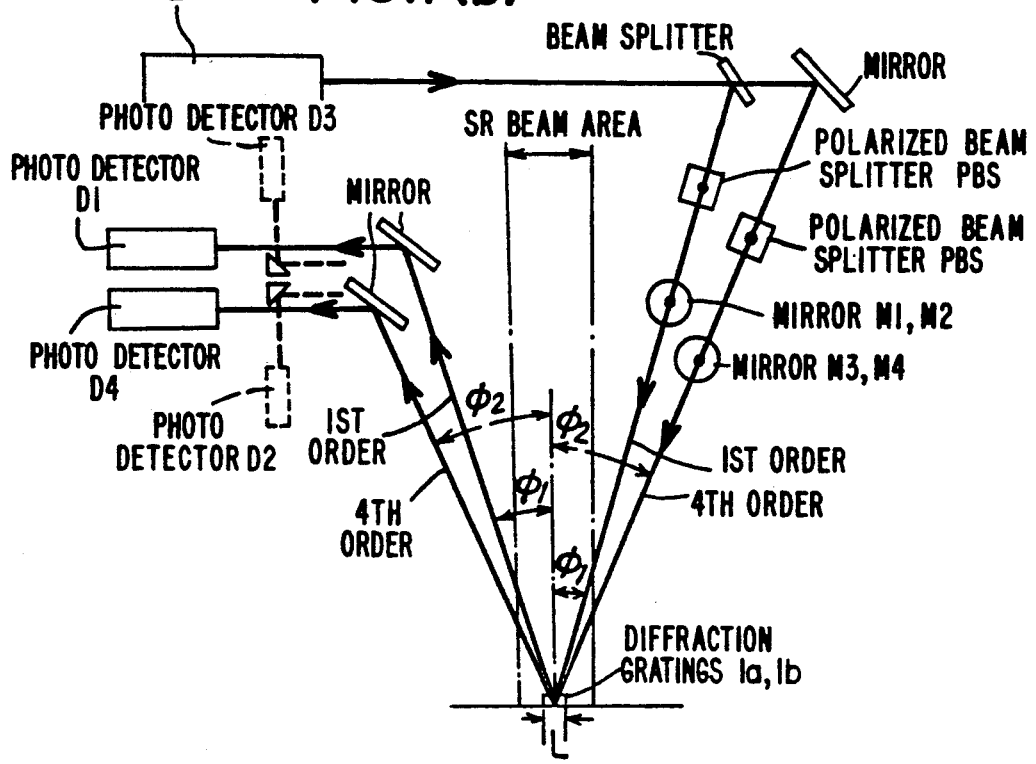
Figure 8A:
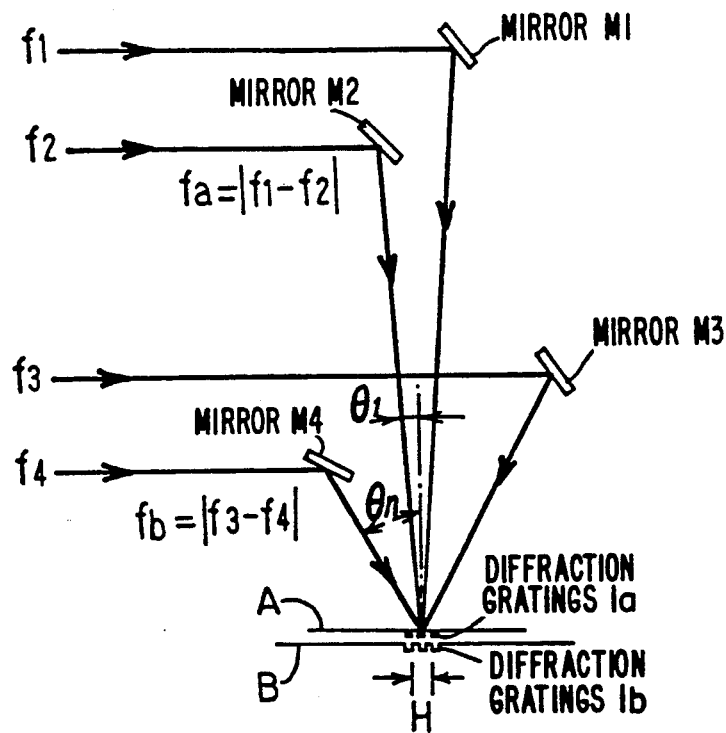
FIG. 8(a)(b) are explanatory views showing basic signal detecting structures of the 8th, 9th and the 19th 20th inventions FIG. 9(a)(b)(c) show waves before and after filterings of the detected signals.
Figure 8B:
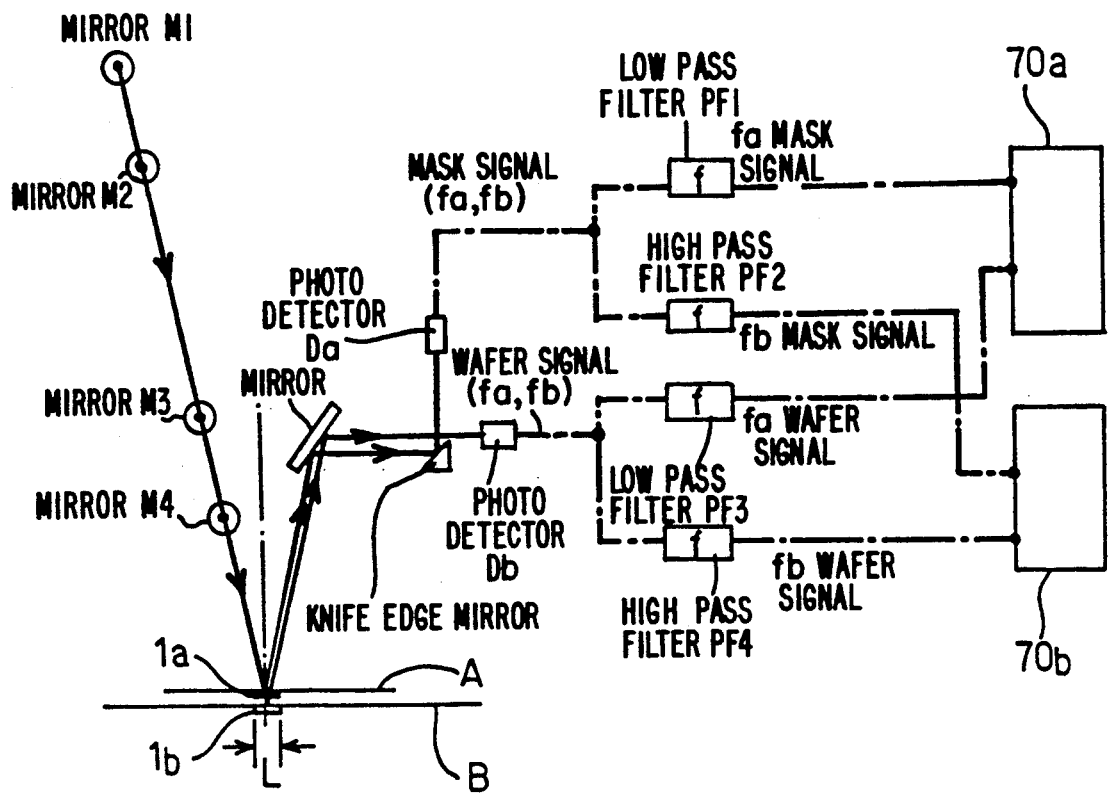

What is claimed is:

1. A position detecting method wherein diffraction gratings having not less than two kinds of diffraction pitches are arranged on both 1st and 2nd substances with parallel plane surfaces; coherent lights having two components with slightly different frequencies and with crossed planes of polarization are injected to said diffraction gratings along a line included in a plane (A) which includes, and hence is defined by, a line normal to said plane surface of said 1st substance, a line normal to said plane surface of said 2nd substance, and a line parallel to the grooves of said diffraction gratings, that is, "vertically", so as to be diffracted along ±n-th order directions which subtend, in a plane (B) orthogonal to the plane (A), angles (e.g. θ of FIG. 5 or θ1 and θ2 of FIG. 21) satisfying diffraction formula with respect to lines normal to the surfaces of said substances, or said coherent lights are injected along specific ±n-th order directions to the diffraction gratings so as to be diffracted "vertically"; the detection of the diffracted lights are conducted in such a manner that, by causing two frequency components diffracted gratings with the same pitches arranged on each of said substances respectively to interfere; the beat signals are generated and the phase differences between beat signals derived from the different substances are measured, and finally in accordance with the thus obtained not less than two kinds of phase differences, the displacing amounts of the 1st and 2nd substances are detected.

2. A position detecting device comprising diffraction gratings which have not less than two kinds of diffraction pitches and are arranged on both 1st and 2nd substances with parallel plane surfaces;
   a light source generating coherent lights having two components with slightly different frequencies and with crossed planes of polarization;
   incident angle adjusting means by which said coherent lights are injected to said diffraction gratings along specific ±n-th order directions so as to be diffracted, in accordance with diffraction formula, along a line included in a plane decided by the normal lines of the surfaces of said substances and the parallel line to the grooves of said diffraction gratings;

light interference means by which said lights diffracted from the diffraction gratings with the same pitches arranged on each of said substances are caused to interfere respectively;

detection means by which beat signals generated by said interference are detected electrically; and signal processing means by which phase differences between the beat signals derived from the different substances are measured respectively, and finally in accordance with the thus obtained not less than two kinds of the phase differences, the displacing amount of the 1st and 2nd substances are detected.

3. A position detecting device comprising diffraction gratings which have not less than two kinds of diffraction pitches and are arranged on both 1st and 2nd substances with parallel plane surfaces;

a light source generating coherent lights having two components with slightly different frequencies and with crossed planes of polarization;

light taking-out means by which said coherent lights, after having been injected to said diffraction gratings along a line included in the plane decided by the normal lines of the surfaces of said substances and the parallel line to the grooves of said diffracted gratings, are taken out along specific ±n-th order directions in accordance with diffraction formula;

light interference means by which said lights taken out from the diffraction gratings with the same pitches arranged on each of said substances are caused to interfere respectively;

detection means by which beat signals generated by said interference are detected electrically; and signal processing means by which phase differences between the beat signals derived from different substances are measured respectively, and finally in accordance with the thus obtained not less than two kinds of the phase differences, the displacing amount of the 1st and 2nd substances are detected.

4. A position aligning device comprising diffraction gratings which have not less than two kinds of diffraction pitches and are arranged on both of 1st and 2nd substances with parallel plane surfaces;

moving means by which said 1st and/or 2nd substances are moved;

a light source generating coherent lights having two components with slightly different frequencies and with crossed planes of polarization;

incident angle adjusting means by which said coherent lights are injected to said diffraction gratings along specific ±n-th order directions so as to be diffracted, in accordance with diffraction formula, along a line included in a plane decided by the normal lines of the surfaces of said substances and a parallel lines to the grooves of said diffraction gratings;

light interference means by which said lights diffracted from the diffraction gratings with the same pitch arranged on each of said substances are caused to interfere respectively;

detection means by which beat signals generated by said interference are detected electrically; and signal processing means by which phase differences between the beat signals derived from different substances are measured respectively, and finally control signals are generated on the basis of the thus obtained not less than two kinds of the phase differences and fed back to said moving means so as to move said 1st and/or 2nd substances for the alignment of the position in accordance with said control signals.

5. A position aligning device comprising diffraction gratings which have not less than two kinds of diffraction pitches and are arranged on both of 1st and 2nd substances with parallel plane surfaces;

moving means by which said 1st and/or 2nd substances are moved;

a light source generating coherent lights having two components with slightly different frequencies and with crossed planes of polarization;

light taking-out means by which said coherent lights, after having been injected to said diffraction gratings along a line included in the plane decided by the normal lines of the surfaces of said substances and the parallel line to the grooves of said diffraction gratings, are taken out along specific ±n-th order directions in accordance with diffraction formula;

light interference means by which said lights taken out from the diffraction gratings with the same pitches arranged on each of said substances are caused to interfere respectively;

detection means by which beat signals generated by said interference are decided electrically; and signals processing means by which phase differences between the beat signals derived from different substances are measured respectively, and finally control signals are generated on the basis of the thus obtained not less than two kinds of phase differences and fed back to said moving means so as to move said 1st and/or 2nd substances for the alignment of the positions in accordance with said control signals.

6. A position detecting method wherein diffraction gratings having not less than two kinds of diffraction pitches as claimed in claim 1 are characterized in that a reflection-type blazed diffraction gratings have cross sections having shapes of isosceles triangles.

7. A postion detecting method wherein a blazed angle corresponding to two equal angles of an isosceles triangle as claimed in claim 6 are determined by values decided from the following equation;

$$n \cdot \lambda = 2P \cdot \sin ab \cdot \cos (\theta - ab)$$

wherein,
n: Diffraction order
$\lambda$: Wavelength of lights
P: Grating pitch
$ab$: Brazed angle
$\theta$: Angle between a line 1 and a line 2, where the line 1 is a projected line of an incident light axis into a plane decided by the line along the grooves of the diffraction gratings and a normal line of the grating surface, the line 2 is said normal line.

8. A position detecting method wherein diffraction gratings having not less than two kinds of diffraction pitches are arranged on both of 1st and 2nd substances with parallel plane surfaces; not less than two couples of coherent lights, each couple of said coherent lights having two components with slightly different frequencies and being able to interfere with each other after having been diffracted so as to generate beat signals with beat frequency different from those of other couples, are injected to said diffraction gratings in such a manner that each couple of the lights corresponding to each pitch of the gratings is injected along specific ±n-th order directions so as to be diffracted along a line included in a plane decided by the normal lines of the surfaces of said substances and the parallel lines to the grooves of said diffraction gratings in accordance with the diffractions, that is "vertically", and that all of the optical axes of the lights diffracted from said 1st and 2nd substances are caused to coincide respectively so as to generate two parallel light fluxes including composite beat signals with not less than two kinds of beat frequencies, composite beat signals originating in said 1st substance are detected separately from that originating in said 2nd substance; furthermore, detected signals are electrically decomposed into the signal with each beat frequency by use of frequency filters; and the phase differences between the beat signals originating in said 1st and 2nd substances with the same beat frequency are measured so as to detect the displacing amounts of said 1st and 2nd substances in accordance with the thus obtained not less than two kinds of phase differences.

9. A position aligning method wherein diffraction gratings having not less than two kinds of diffraction pitches are arranged on both of 1st and 2nd substances with parallel plane surfaces not less than two couples of coherent lights, each couple of said coherent lights having two components with slightly different frequencies and being able to interfere with each other after having been diffracted so as to generate beat signals with beat frequency different from those of other couples, are injected to said diffraction gratings in such a manner that each couple of lights corresponding to each pitch of the gratings is injected along a specific ±n-th order direction so as to be diffracted along a line included in a plane decided by the normal lines of the surfaces of said substances and a parallel line to the grooves of said diffraction gratings in accordance with diffraction formula and that all of optical axes of lights diffracted from said 1st and 2nd substances are caused to coincide respectively so as to generate two parallel light fluxes including composite beat signals with not less than two kinds of beat frequencies; a composite beat signal originating in said 1st substance is detected separately from that originating in said 2nd substance; furthermore said composite beat signals are electrically decomposed into the signal with each beat frequency by use of frequency filters; phase differences between the beat signals originating in said 1st and 2nd substances with the same beat frequency are measured; and finally the positions of said 1st and 2nd substances are aligned in accordance with the thus obtained not less than two kinds of phase differences.

10. A position detecting method wherein diffraction gratings having not less than two kinds of diffraction pitches are arranged on both of 1st and 2nd substances with parallel plane surface; not less than two couples of coherent lights, each couple of said coherent lights having two components with slightly different frequencies and being able to interfere with each other after having been diffracted so as to generate beat signals with plane of polarization different from those of other couples, are injected to said diffraction gratings in such a manner that each couple of the lights corresponding to each pitch of the gratings is injected along specific ±n-th order directions so as to be diffracted along a line included in a plane decided by the normal line of the surfaces of said substances and a parallel line to the grooves of said diffraction gratings in accordance with diffraction formula and that all of optical axes of lights diffracted from said 1st and 2nd substances are caused to coincide respectively so as to generate two parallel light fluxes including composite beat signals with not less than two kinds of plane of polarization; composite beat signals are optically decomposed respectively into the signal with each plane of polarization before detection; the beat signals thus decomposed are detected separately; and furthermore the phase differences between the beat signals originating in said 1st and 2nd substances with the same plane of polarization are measured so as to detect displacing amounts of said 1st and 2nd substances in accordance with the thus obtained not less than two kinds of the phase difference.

11. A position aligning method wherein diffraction gratings having not less than two kinds of diffraction pitches are arranged on both of 1st and 2nd substances with parallel plane surfaces; not less than two couples of coherent lights, each couple of said coherent lights having two components with slightly different frequencies and being able to interfere with each other after having been diffracted so as to generate beat signals with the plane of polarization different from those of other couples, are injected to said diffraction gratings in such a manner that each couple of the lights corresponding to each pitch of the gratings is injected along specific ±n-th order directions so as to be diffracted along the line included in the plane decided by the normal lines of the surfaces of said substances and the parallel line to the grooves of said diffraction gratings in accordance with the diffraction formula and that all of the optical axes of the lights diffracted from said 1st and 2nd substances are caused to coincide respectively so as to generate two parallel light fluxes including composite beat signals with not less than two kinds of planes of polarization; the composite beat signals are optically decomposed respectively into the signal with each plane of polarization before detection; the beat signals thus decomposed are detected separately; furthermore the phase differences between the beat signals originating in said 1st and 2nd substances with the same plane of polarization are measured; and finally the positions of said 1st and 2nd substances are aligned in accordance with the thus obtained not less than two kinds of phase differences.

12. A position detecting method wherein coherent lights having two components with slightly different frequencies and with crossed planes of polarization are injected to 1st and 2nd diffraction gratings arranged on 1st and 2nd substances with parallel plane surfaces respectively along lines included in a plane (A) which includes, and hence is defined by, a line normal to said plane surface of said 1st substance, a line normal to said plane surface of said 2nd substance, and a line parallel to the grooves of said diffraction gratings, that is, "vertically", so as to be diffracted along not less than two kind of directions correspondingly to the different ±n-th order directions of which projected lines into the plane (B) being orthogonal to plane (A) have angles satisfying the diffraction formula against the normal line of the surfaces of said substances, or said coherent lights are injected along not less than two kinds of directions correspondingly to the different ±n-th order directions with different absolute value n of the order so as to be diffracted "vertically"; beat signals are generated by causing the lights originating in the same diffraction grating and the same absolute number n to interfere; furthermore the phase of the beat signal originating in the 1st diffraction grating is compared with that originating in the 2nd diffraction grating with the same n and the phase differences are measured; and finally the displacing amount of the 1st and 2nd substances are detected in accordance with the thus obtained not less than two kinds of phase difference.

13. A position detecting device comprizing 1st diffraction gratings arranged on a 1st substance with a plane surface;
- 2nd diffraction gratings arranged on a 2nd substance with a plane surface parallel to said 1st diffraction gratings arranged on said 1st substance;
- a light source generating coherent lights having two components with slightly different frequencies and with crossed planes of polarization;
- incident angle adjusting means by which said coherent lights are injected to said diffraction gratings along not less than two kinds of directions correspondingly to the different ±n-th order directions with different absolute values n of the order so as to be diffracted along the lines included in the plane decided by normal lines of the surfaces of said substances and the parallel line to the grooves of said diffraction gratings in accordance with the diffraction formula;
- light intereference means by which the lights diffrated from each of said diffraction gratings are caused to interefere with the same absolute number n;
- detecting means by which beat signals generated by said interference are detected; and
- signal processing means by which the phase of the beat signal originating in the 1st diffraction grating is compared with that originating in the 2nd diffraction grating, the phase differences are measured and finally displacing amounts of the 1st and 2nd substances are detected in accordance with the thus obtained not less than two kinds of phase differences.

14. A position detecting device comprizing 1st diffraction gratings arranged on a 1st substance with plane surface;
- 2nd diffraction gratings arranged on a 2nd substance with a plane surface parallel to said 1st diffraction grating arranged on said 1st substance;
- a light source generating coherent lights having two components with slightly different frequencies and with crossed planes of polarization;
- lights taking-out means by which said coherent lights, after having been injected to said diffraction gratings along the lines included in the plane decided by the normal lines of the surfaces of said substances and the parallel line to the grooves of said diffraction gratings and diffracted in accordance with the diffraction formula, are taken out along not less than two kinds of directions correspondingly to the different ±n-th order directions with different absolute values n of the order;
- light interference means by which said lights diffracted along not less than two kinds of directions from each of said diffraction gratings are caused to interfere respectively with the same absolute number n;
- detecting means by which the beat signals generated by said interference are detected; and
- signal processing means by which the phase of the beat signal originating in the 1st diffraction grating is compared with the phase of the beat signals originating in the 2nd diffraction grating, the phase differences are measured, and finally displacing amounts of the 1st and 2nd substances are detected in accordance with the thus obtained not less than two kinds of the phase differences.

15. A position aligning device comprising 1st diffraction gratings arranged on a 1st substance with a plane surface; 2nd diffraction gratings arranged on a 2nd substance with a plane surface parallel to said 1st diffraction gratings arranged on said 1st substance; moving means by which said 1st and/or 2nd substances are moved; a light source generating the cohorent lights having two components with slightly different frequencies and with crossed planes of polarization; incident angle adjusting means by which said coherent lights are injected to said diffraction gratings along not less than two kinds of directions correspondingly to the different ±n-th order directions with different absolute values n of the order so as to be diffracted along the lines included in the plane decided by the normal line of the surfaces of said substances and the parallel line to the grooves of said diffraction gratings in accordance with the diffraction formula; light interference means by which said lights diffracted from each of said diffraction gratings are caused to interfere with the same absolute number n; detecting means by which the beat signals generated by said interference are detected; and signal processing means by which the phase of the beat signal originating in the 1st diffraction grating is compared with that originating in the 2nd diffraction grating, the phase diffrences are measured, and finally the control signal are generated on the basis of the thus obtained not less than two kinds of phase differences and fed back to said moving means so as to move said 1st and/or 2nd substances for the alignment of the position in accordance with said control signals.

16. A position detecting device comprising 1st diffraction gratings arranged on the 1st substance with the plane surface; 2nd diffraction gratings arranged on a 2nd substance with a plane surface parallel to said 1st diffraction gratings arranged on said 1st substance; moving means by which said 1st and/or 2nd substances are moved; a light source generating the coherent lights having two componenis with slightly different frequencies and with crossed planes of polarization; lights taking-out means by which said coherent lights, after having been injected to said diffraction gratings along the line included in the plane decided by the normal line of the surfaces of said substances and the parallel line to the grooves of said diffraction gratings and diffracted in accordance with the diffraction formula, are taken out along not less than two kinds of directions correspondingly to the different ±n-th order directions with different absolute values n of the order; light interfernce means by which said lights diffrated along not less than two kinds of directions from each of said diffraction gratings are caused to interfere with the same absolute number n; detecting means by which the beat signals generated by said interference are detected; and signal processing means by which the phase of the beat signal originating in the 1st diffraction grating is compared with the beat signals originating in the 2nd diffraction grating, the phase differences are measured, and finally the control signals are generated on the basis of the thus obtained not less than two kinds of phase differences and fed back to said moving means so as to move said 1st and/or 2nd substances and to align the position in accordance with said control signals.

17. A position detecting method wherein the 1st and 2nd diffraction gratings as claimed in claim 12 are characterized in that reflection-type blazed diffraction gratings have cross sections having shapes of isosceles triangles.

18. A position detecting method wherein the blazed angle which correspondes to the two equal angles of the isosceles triangle in claim 17 is characterized by the value decided from the following equation;

$$n \cdot \lambda = 2P \cdot \sin ab \cdot \cos(\theta - ab)$$

where,
- n: Diffraction order
- $\lambda$: Wavelength of lights
- P: Grating pitch
- $ab$: Blazed angle
- $\theta$: Angle between a line1 and a line 2, where line 1 is a projected line of the incident light axis into a plane decided by the line along the grooves of the diffraction gratings and the normal line of the grating surface, and the line 2 is said normal line.

19. A position detecting method wherein not less than two couples of coherent lights, each said couple of said coherent lights having two components with slightly different frequencies and being able to interfere with each other after having been diffracted so as to generate beat signal with beat frequency different from those of other couples, are injected to diffraction gratings arranged on both 1st and 2nd substances with parallel plane surfaces in such a manner that respective couples of the lights are injected along different $\pm$n-th order directions with different absolute values n of the order so as to be diffracted along a line included in the plane decided by the normal lines of the surfaces of said substances and the parallel line to the grooves of said diffraction gratings in accordance with the diffraction formula and that all of the optical axes of the lights diffracted from said 1st and 2nd substances are caused to coincide respectively so as to generate two parallel light fluxes including composite beat signals with not less than two kinds of beat frequencies; the composite beat signal originating in said 1st substance is detected separately from that originating in said 2nd substance, and furthermore, detected signals are electrically decomposed into the signal with each beat frequency by use of frequency filters, the phase differences between the beat signals originating in said 1st and 2nd substances with the same beam frequency are measured so as to detect the displacing amount of said 1st and 2nd substances in accordance with the thus obtained not less than two kinds of phase differences.

20. A position aligning method wherein not less than two couples of coherent lights, each said couple of said coherent lights having two components with slightly different frequencies and being able to interfere with each other after having been diffracted so as to generate beat signal with beat frequency different from those of other couples, are injected to diffraction gratings arranged on both 1st and 2nd substances with parallel plane surfaces in such a manner that respective couples of the lights are injected along different $\pm$n-th order directions with different absolute values n of the order so as to be diffracted along a line included in the plane decided by the normal line of the surfaces of said substances and the parallel line to the grooves of said diffraction gratings in accordance with the diffraction formula and that all of the optical axes of the lights diffracted from said 1st and 2nd substances are caused to coincide respectively so as to generate two parallel light fluxes including composite beat signal with not less than two kinds of beat frequencies; the composite beat signal originating in said 1st substance is detected separately from the composite signals originating in said 2nd substance; and furthermore, detected signals are electrically decomposed into the signal with each beat frequency by use of frequency filters, the phase differences between the beat signals originating in said 1st and 2nd substances with the same beat frequency are measured, and finally the position of said 1st and 2nd substances is aligned in accordance with the thus obtained not less than two kinds of phase differences.

21. A position detecting method wherein not less than two couples of coherent lights, each said couple of said coherent lights having two components with slightly different frequencies and being able to interfere with each other after having been diffracted so as to generate beat signals with the plane of polarization different from those of other couples, are injected to the diffraction gratings arranged on both 1st and 2nd substances with parallel plane surfaces in such a manner that respective couples of the lights are injected along different $\pm$n-th order directions with different absolute values n of the order so as to be diffracted along a line included in the plane decided by the normal lines of the surfaces of said substances and the parallel line to the grooves of said diffraction gratings in accordance with the diffraction formula, and that all of the optical axes of the lights diffracted from said 1st and 2nd substances are caused to coincide respectively so as to generate two parallel light fluxes including composite beat signals with not less than two kinds of planes of polarization; the composite beat signals are optically decomposed respectively into the signal with each plane of polarization before detection; the beat signals thus decomposed are detected separately; and furthermore the phase differences between the beat signals originating in said 1st and 2nd substances are measured so as to detect the displacing amount of said 1st and 2nd substances in accordance with the thus obtained not less than two kinds of phase difference.

22. A position aligning method wherein not less than two couples of coherent lights, each said couple of said coherent lights having two components with slightly different frequencies and being able to interfere with each other after having been diffracted so as to generate beat signals with the plane of polarization different from those of other couples, are injected to diffraction gratings arranged on both 1st and 2nd substances with parallel plane surfaces in such a manner that respective couples of the lights are injected along different $\pm$n-th order directions with different absolute values n of the order so as to be diffracted along a line included in the plane decided by the normal line of the surfaces of said substances and the parallel line to the grooves of said diffraction gratings in accordance with the diffraction formula, and that all of the optical axes of the lights diffracted from said 1st and 2nd substances are caused to coincide respectively so as to generate two parallel light fluxes including composite beat signals with not less than two kinds of planes of polarization; the composite beat signals are optically decomposed respectively into the signal with each plane of polarization before detection; the beat signals thus decomposed are detected separately; furthermore the phase differences between the beat signals originating in said 1st and 2nd substances are measured; and finally the position of said 1st and 2nd substances are aligned in accordance with the thus obtained not less than two kinds of phase differences.

* * * * *